United States Patent [19]
Konno

[11] Patent Number: 5,828,250
[45] Date of Patent: Oct. 27, 1998

[54] DIFFERENTIAL DELAY LINE CLOCK GENERATOR WITH FEEDBACK PHASE CONTROL

[75] Inventor: Katsushi Konno, Ibaraki-ken, Japan

[73] Assignee: Intel Corporation, Santa Clara, Calif.

[21] Appl. No.: 644,564

[22] Filed: May 10, 1996

Related U.S. Application Data

[63] Continuation of Ser. No. 396,119, Feb. 28, 1995, abandoned, which is a continuation-in-part of Ser. No. 301,321, Sep. 6, 1994, Pat. No. 5,537,068.

[51] Int. Cl.$^6$ ............................................. G06F 1/08
[52] U.S. Cl. ........................... 327/116; 327/141; 327/153; 327/161; 377/47
[58] Field of Search ........................... 327/261, 113–117, 327/263, 269–271, 276, 277, 285, 291–294, 299, 141, 145–150, 152, 153, 155, 156–158, 161, 162, 233–237, 243, 244; 377/47

[56] References Cited

U.S. PATENT DOCUMENTS

| | | | |
|---|---|---|---|
| 4,266,197 | 5/1981 | Breithaupt | 327/233 |
| 4,675,612 | 6/1987 | Adams et al. | 327/161 |
| 4,700,347 | 10/1987 | Rettberg et al. | 327/250 |
| 4,789,996 | 12/1988 | Butcher | 327/158 |
| 4,870,665 | 9/1989 | Vaughn | 327/294 |
| 4,999,526 | 3/1991 | Dudley | 327/141 |
| 5,022,056 | 6/1991 | Henderson et al. | 327/141 |
| 5,022,057 | 6/1991 | Nishi et al. | 327/294 |
| 5,097,489 | 3/1992 | Tucci | 328/55 |
| 5,101,117 | 3/1992 | Johnson et al. | 307/269 |
| 5,118,975 | 6/1992 | Hillis et al. | 307/602 |
| 5,146,478 | 9/1992 | Dragotin | 327/250 |
| 5,148,113 | 9/1992 | Wight et al. | 327/238 |
| 5,191,234 | 3/1993 | Murakami et al. | 327/172 |
| 5,223,755 | 6/1993 | Richley | 307/603 |
| 5,260,608 | 11/1993 | Marbot | 327/161 |
| 5,281,874 | 1/1994 | Sorrells et al. | 327/261 |
| 5,317,202 | 5/1994 | Waizman | 307/269 |
| 5,363,406 | 11/1994 | Han | 327/172 |
| 5,374,860 | 12/1994 | Llewellyn | 327/276 |
| 5,438,254 | 8/1995 | Ho et al. | 327/12 |

Primary Examiner—Timothy P. Callahan
Assistant Examiner—T. T. Lam
Attorney, Agent, or Firm—Blakely, Sokoloff, Taylor & Zafman

[57] ABSTRACT

An on-chip clock waveform generator for generating from an externally supplied clock (EFI) an on-chip (internal) clock with a 50% duty cycle having a clock rate of ½, 1, or 2 times that of EFI, is based on a tapped delay line with a tap-to-tap differential delay of approximately 1% of the external clock (EFI) period. The waveform generator detects the tap at which a full period of delay occurs between delay line input and the tap. By knowing the tap for a first full period delay the generator determines the taps at which the ¼, ½, and ¾ period waveform states can be observed. The pulses corresponding to fractional periods, are used to generate standard pulse width streams that correspond to ¼ period intervals. A programmed multiplexer/selector selects the proper sequence from these pulse streams to drive an RS flip-flop in order to produce the output 50% duty-cycle clock running at ½, 1, or 2 times the external (EFI) clock. Generally, the system can produce output clocks with 50% duty cycle and with rates greater than, equal to, or less than the external clock (EFI). Other optional operating modes generate 25% duty cycle waveforms at ½ the rate of EFI. A feedback signal is generated by comparing the phase of the generated on-chip clock with the phase of EFI which is used to adjust the overall delay of the generator in order to improve synchronism between EFI and the on-chip clock.

28 Claims, 34 Drawing Sheets

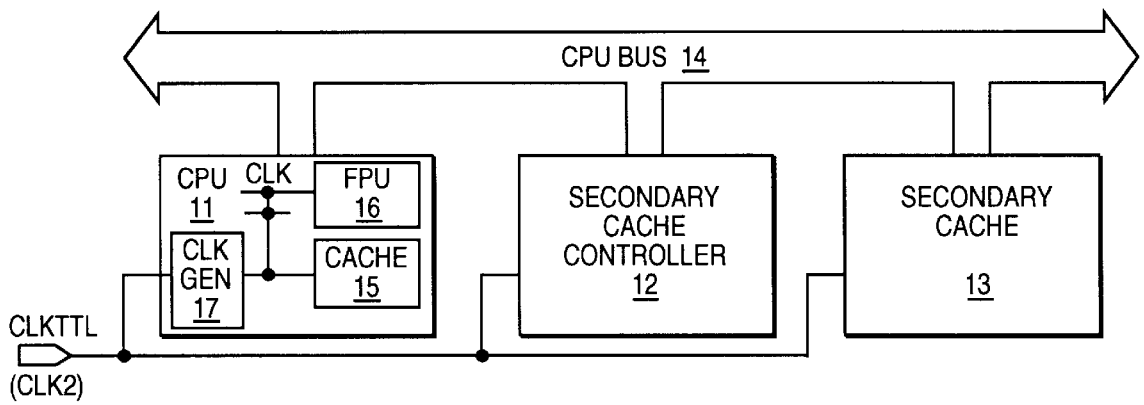
FIG_1 (PRIOR ART)
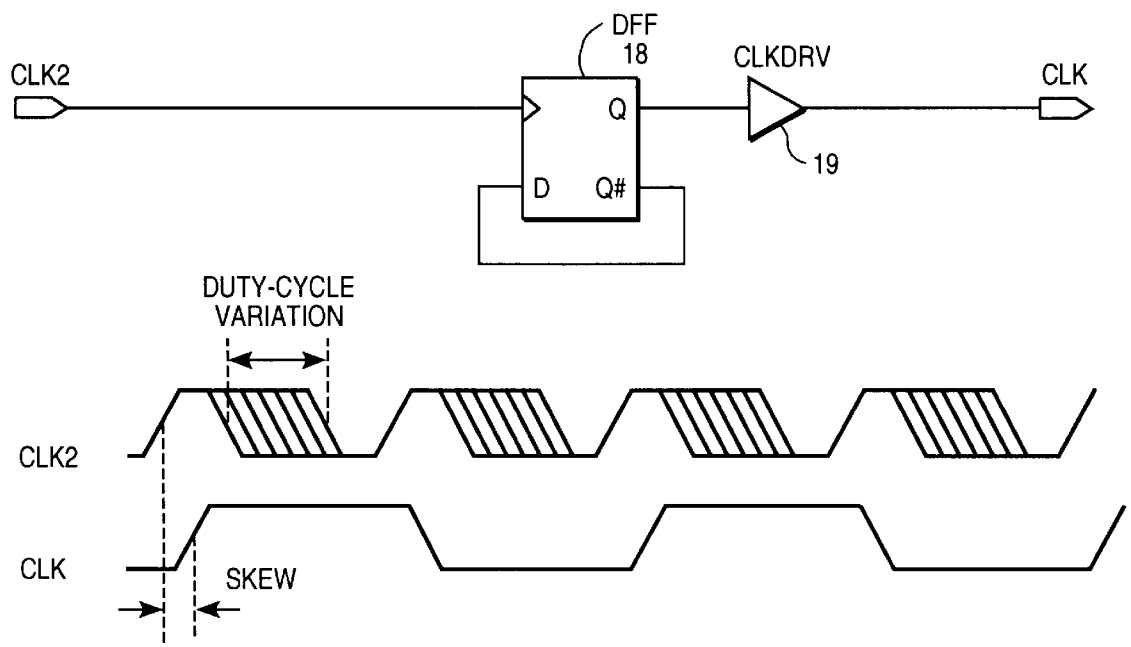
FIG_2 (PRIOR ART)

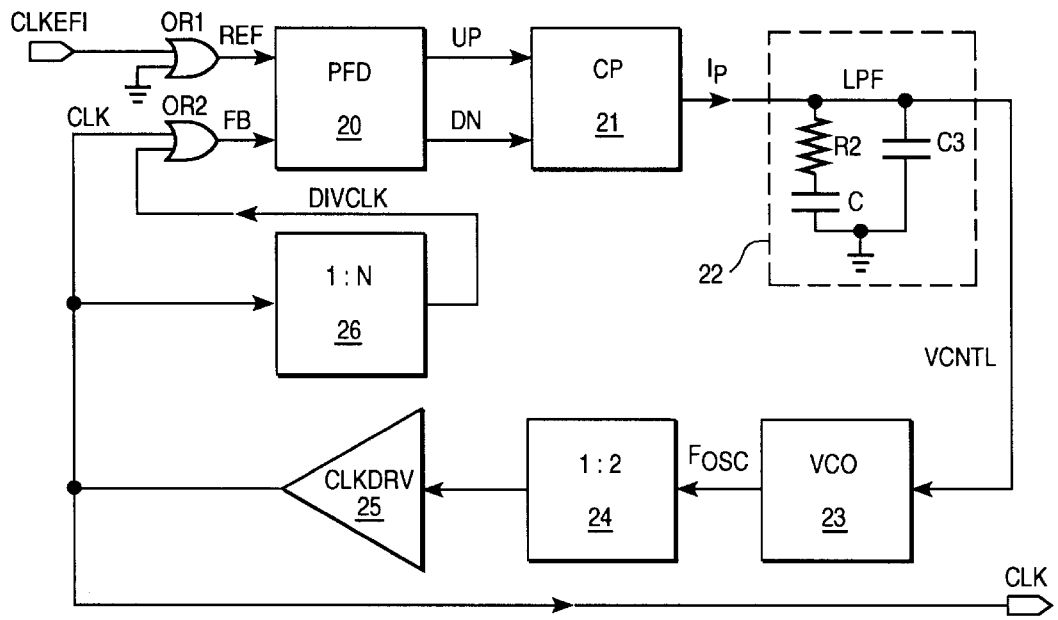
FIG_3A (PRIOR ART)
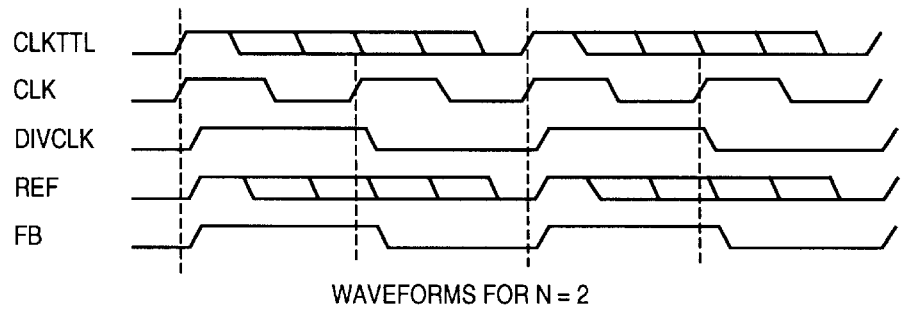
WAVEFORMS FOR N = 2
FIG_3B (PRIOR ART)
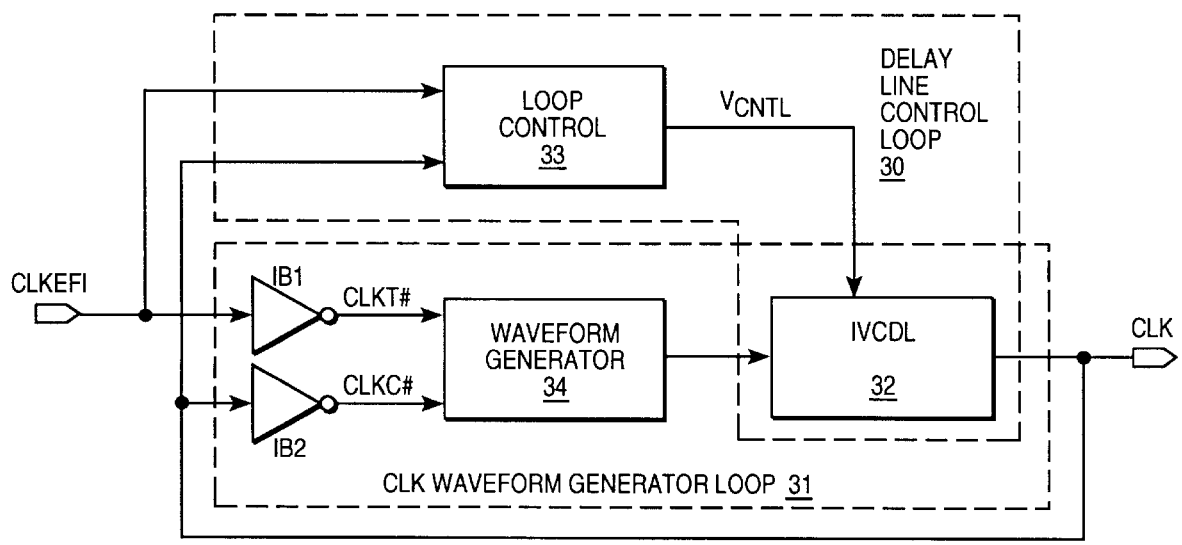
FIG_4 (PRIOR ART)

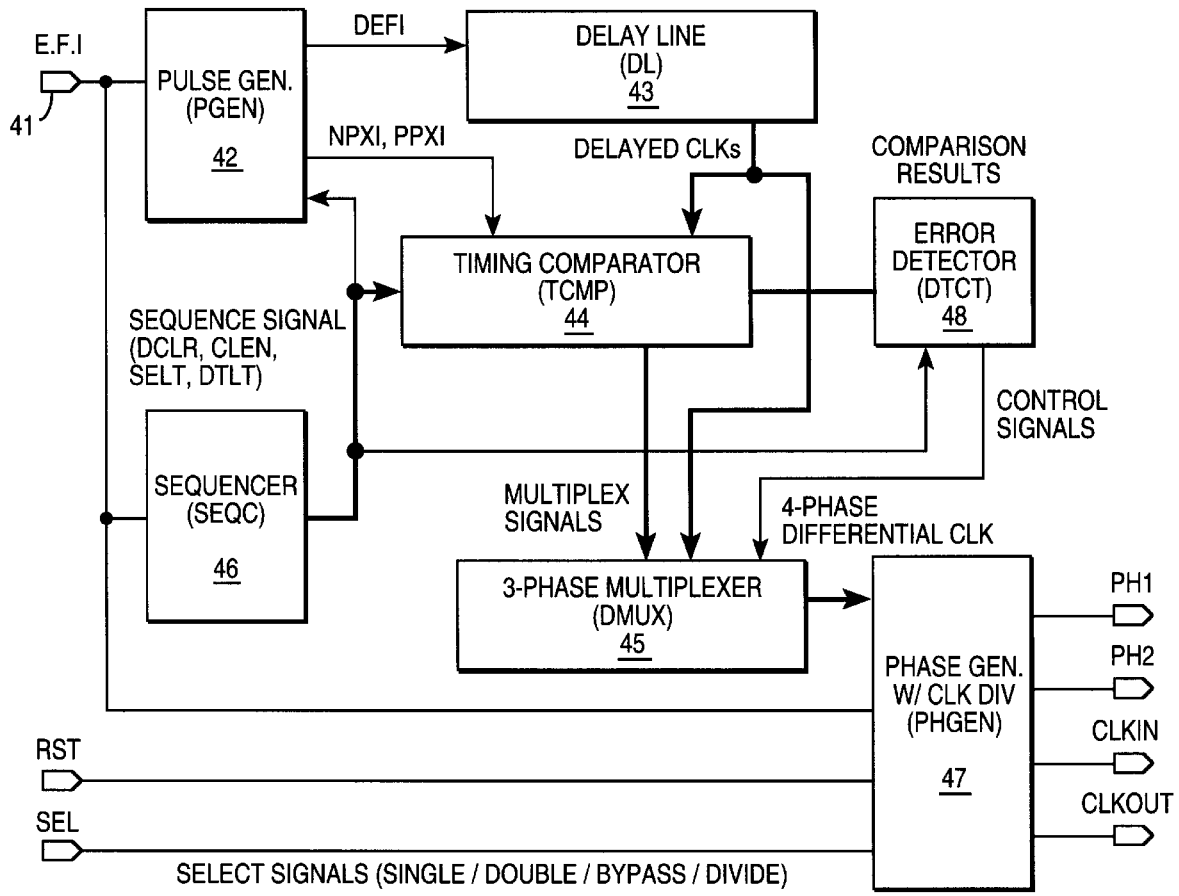
FIG_5

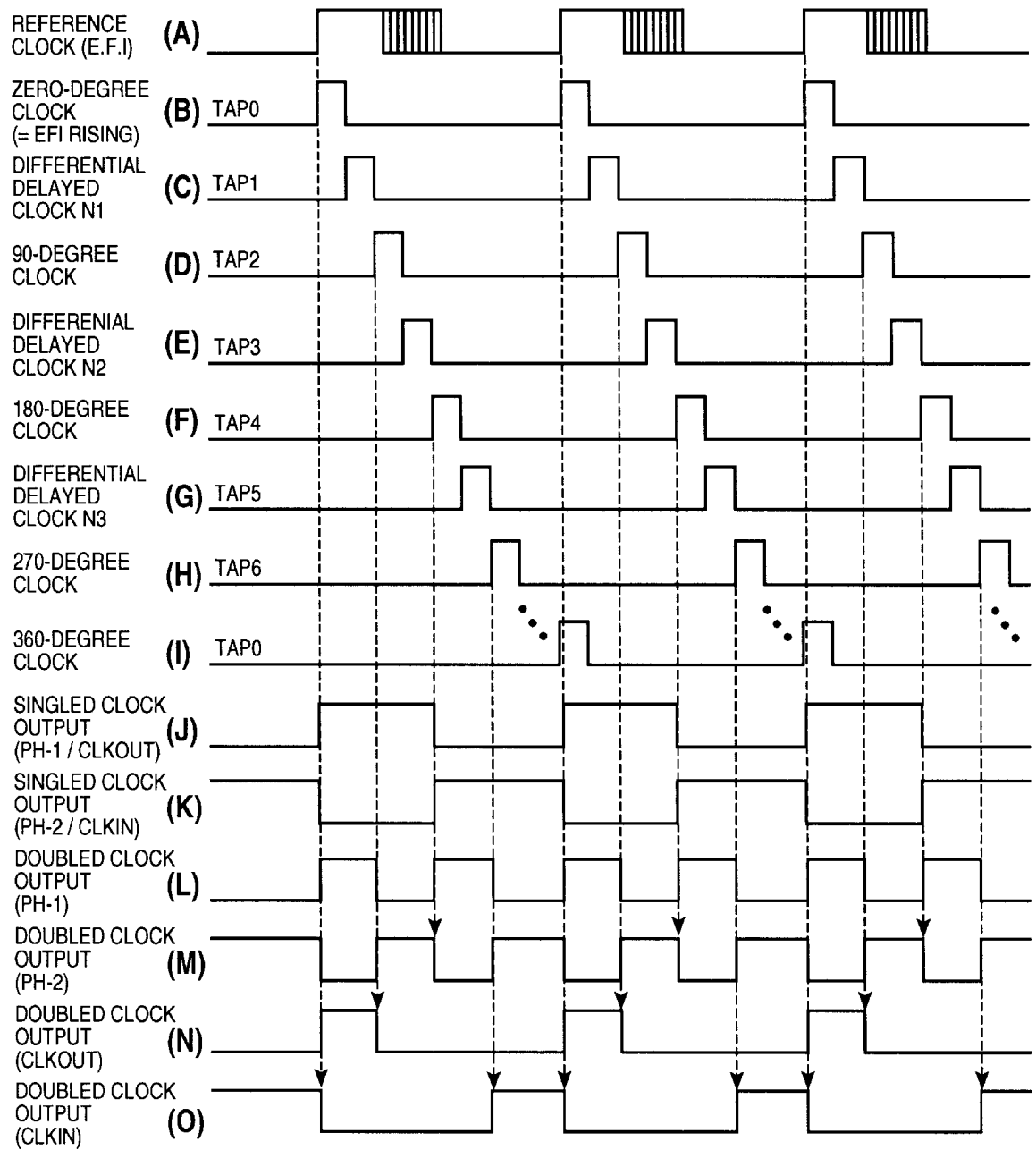
FIG_6

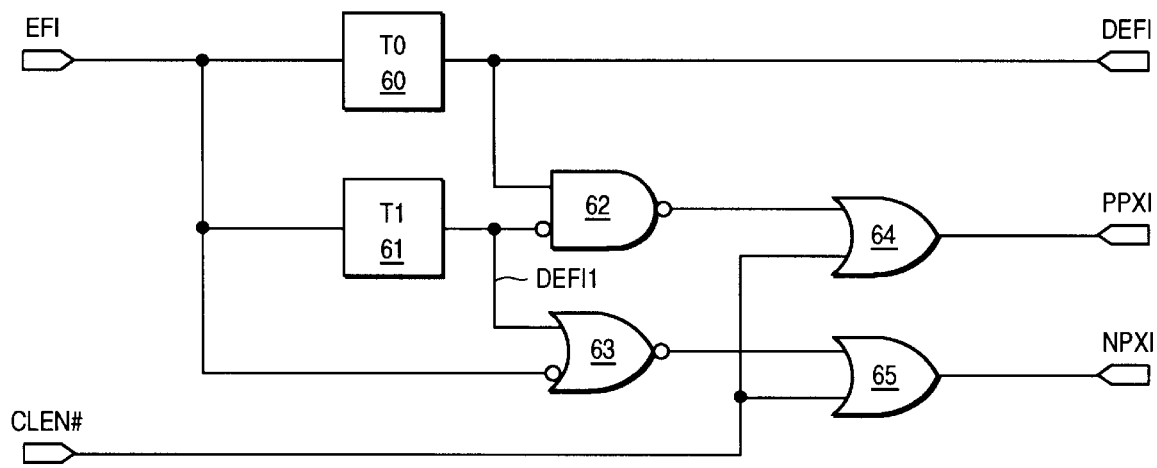
FIG_7

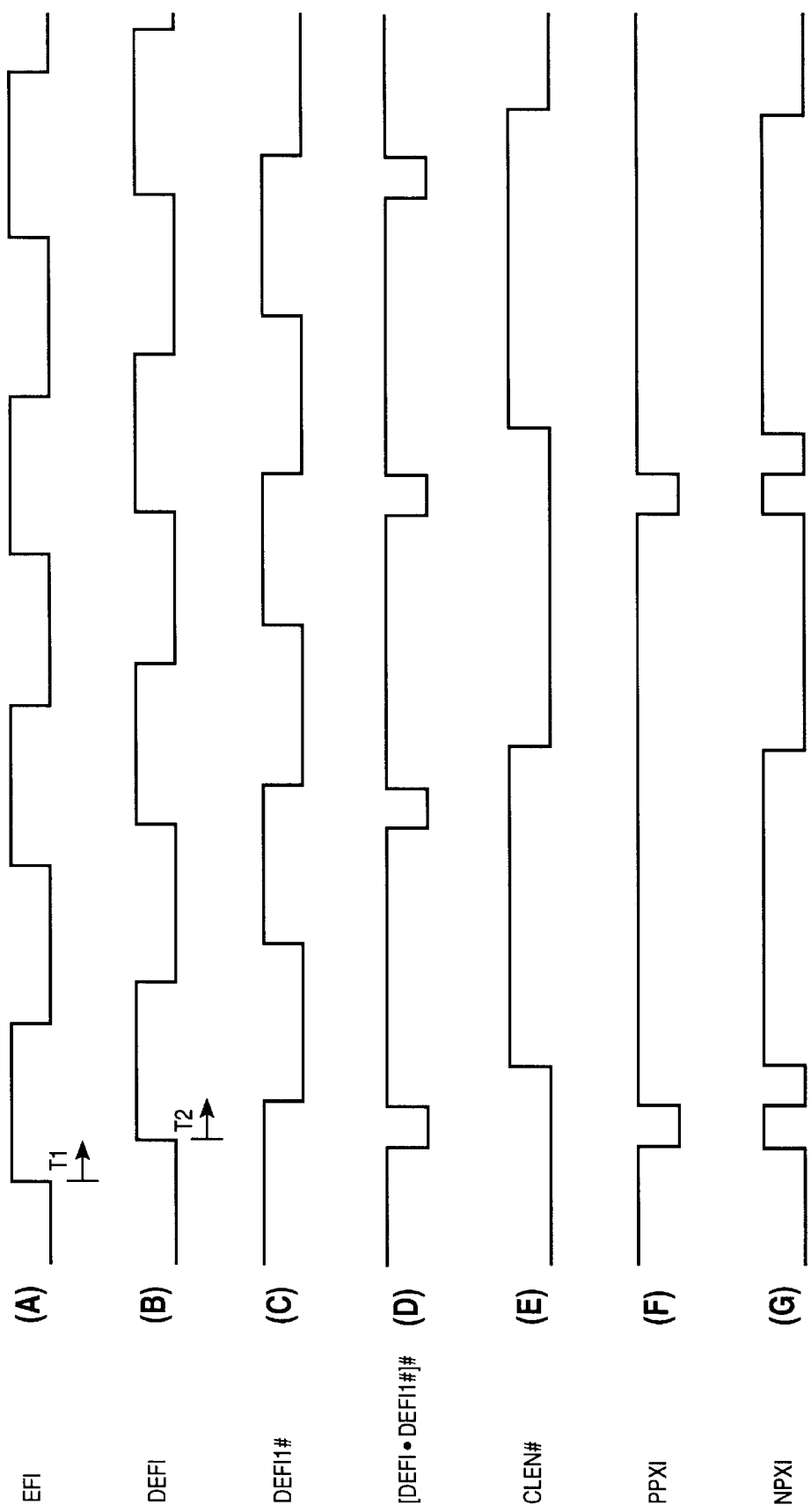

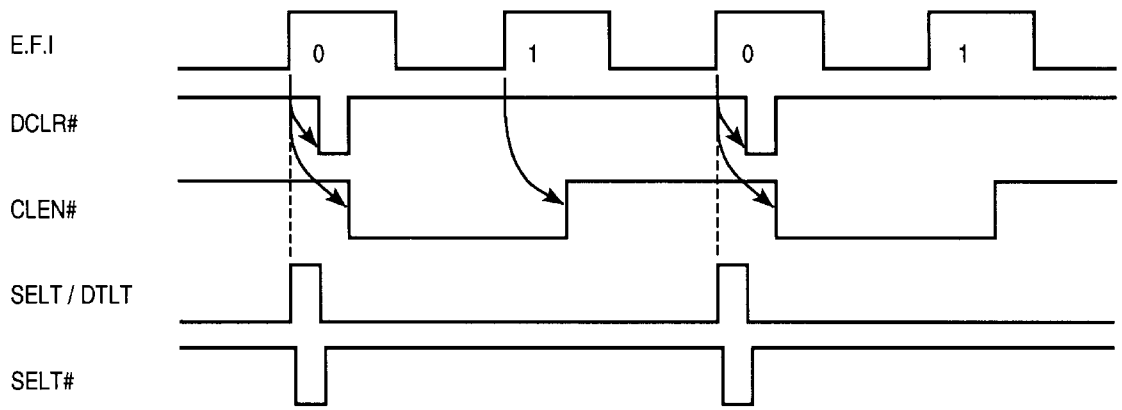
FIG_9
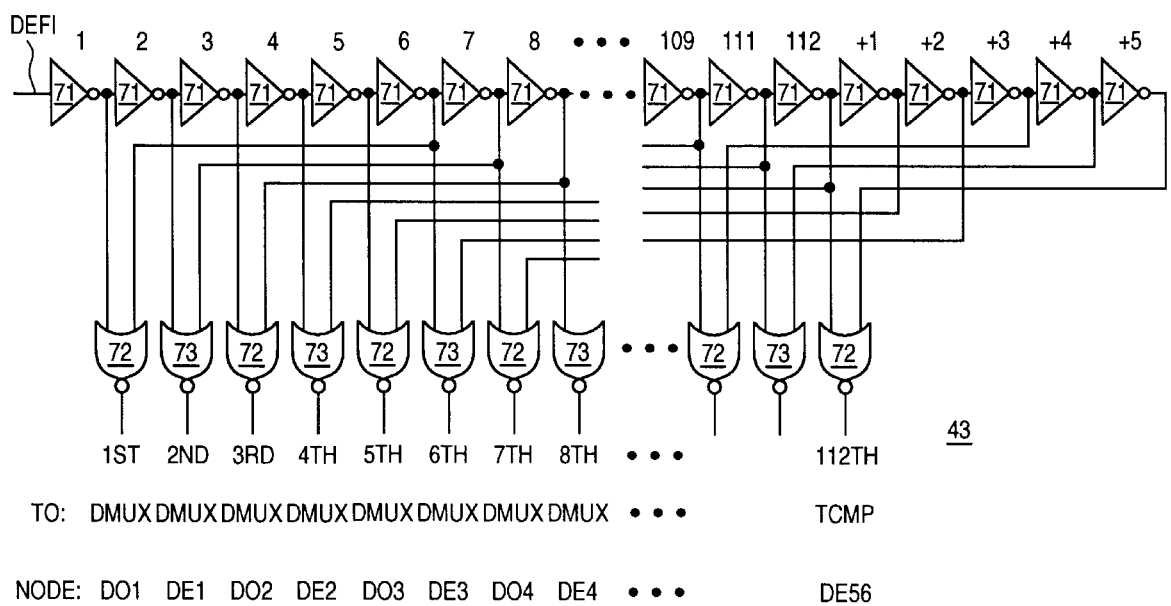
FIG_11

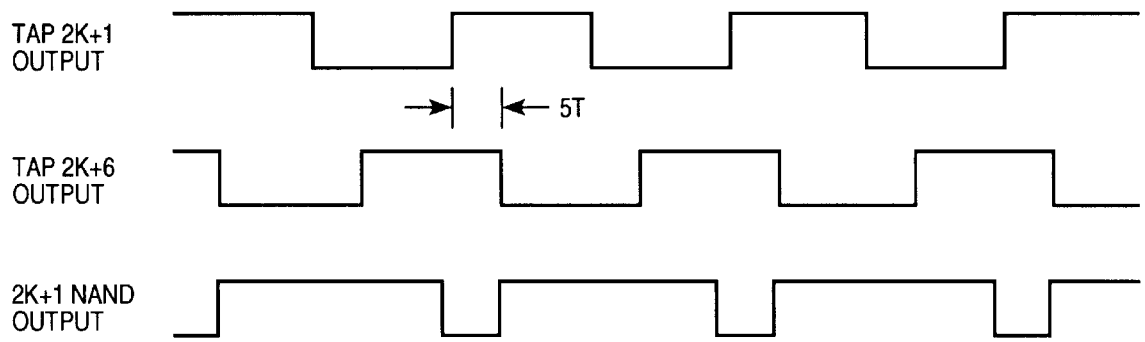
FIG_12A
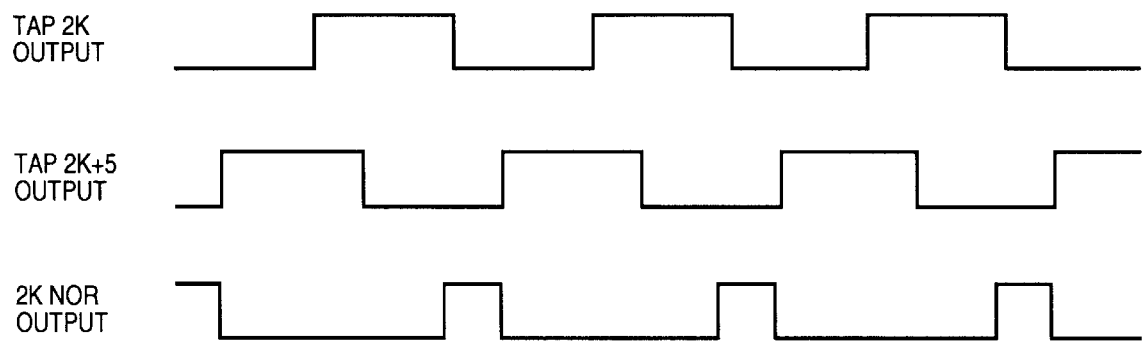
FIG_12B

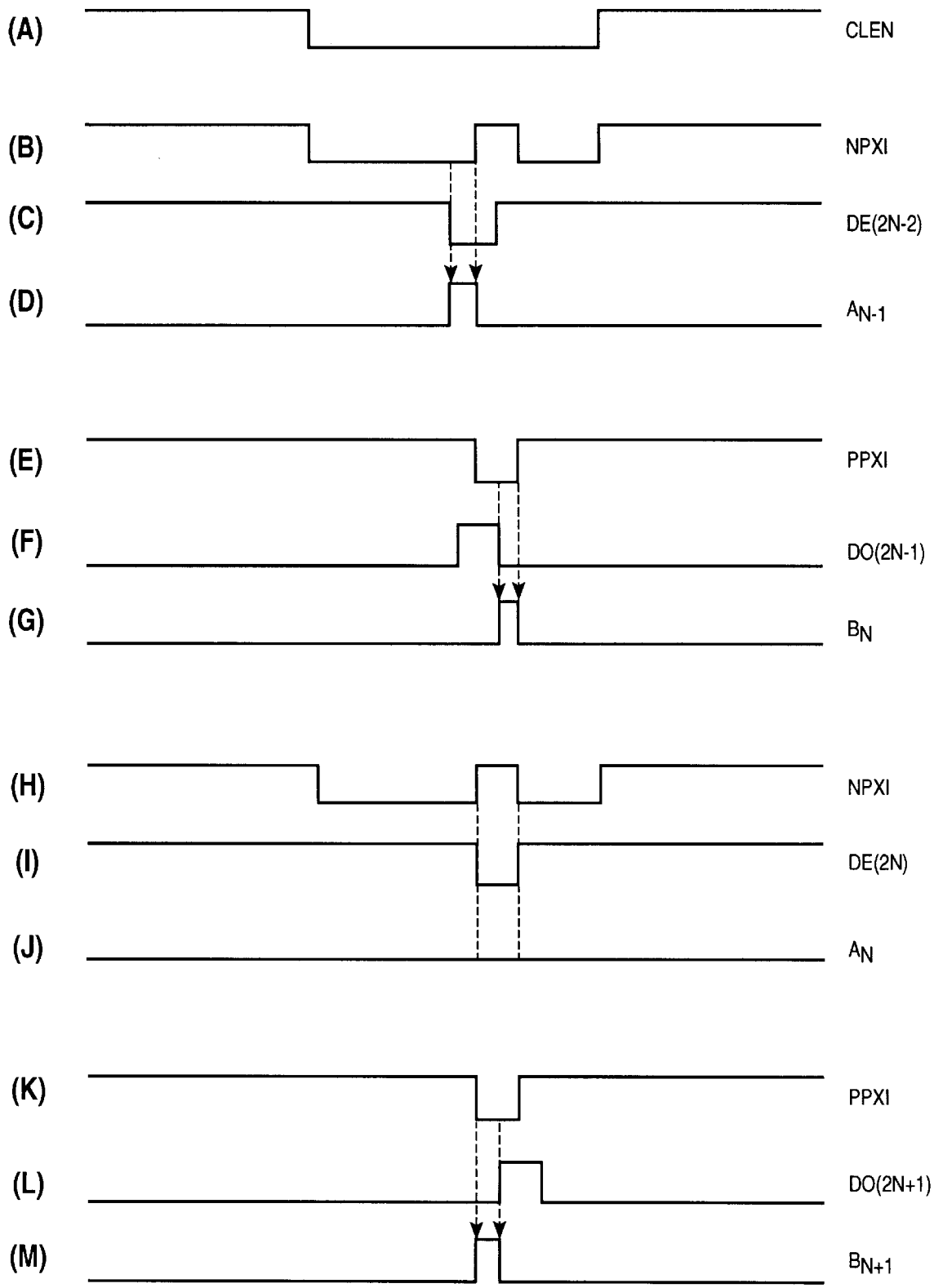
FIG_15

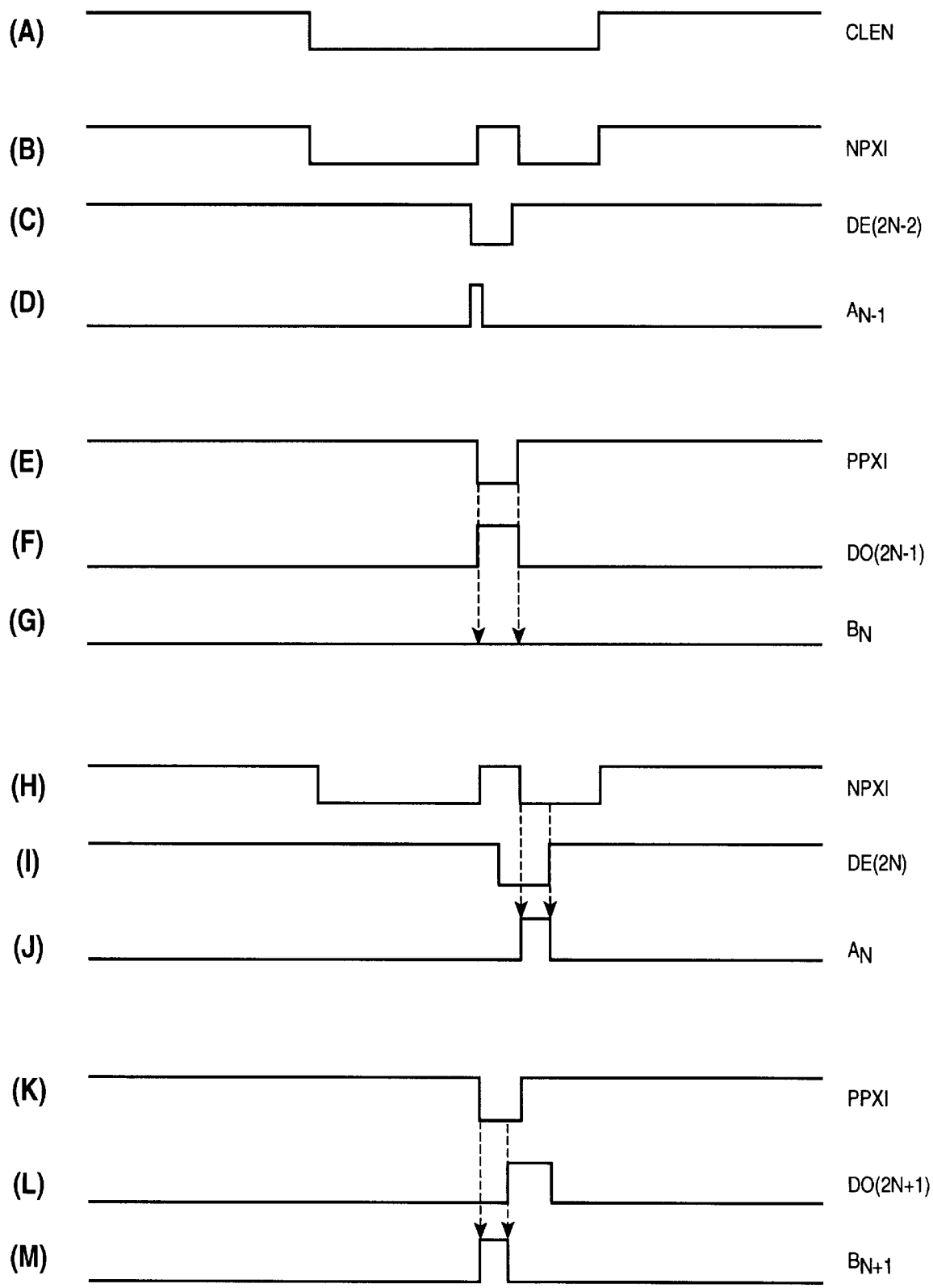
FIG_16

| NXRIN$_R$ A$_{N-1}$ | B$_N$ | A$_N$ | DS$_N$ S$_N$ | PR$_N$ | WXROUT A$_N$ |
|---|---|---|---|---|---|
| 0 | 0 | 0 | 0 | 1 | 0 |
| 0 | 0 | 1 | 0 | 1 | 1 |
| 0 | 1 | 0 | 0 | 1 | 0 |
| 0 | 1 | 1 | 0 | 1 | 1 |
| 1 | 0 | 0 | 1 | 0 | 0 |
| 1 | 0 | 1 | 1 | 0 | 1 |
| 1 | 1 | 0 | 1 | 1 | 0 |
| 1 | 1 | 1 | 0 | 1 | 1 |

FIG_17

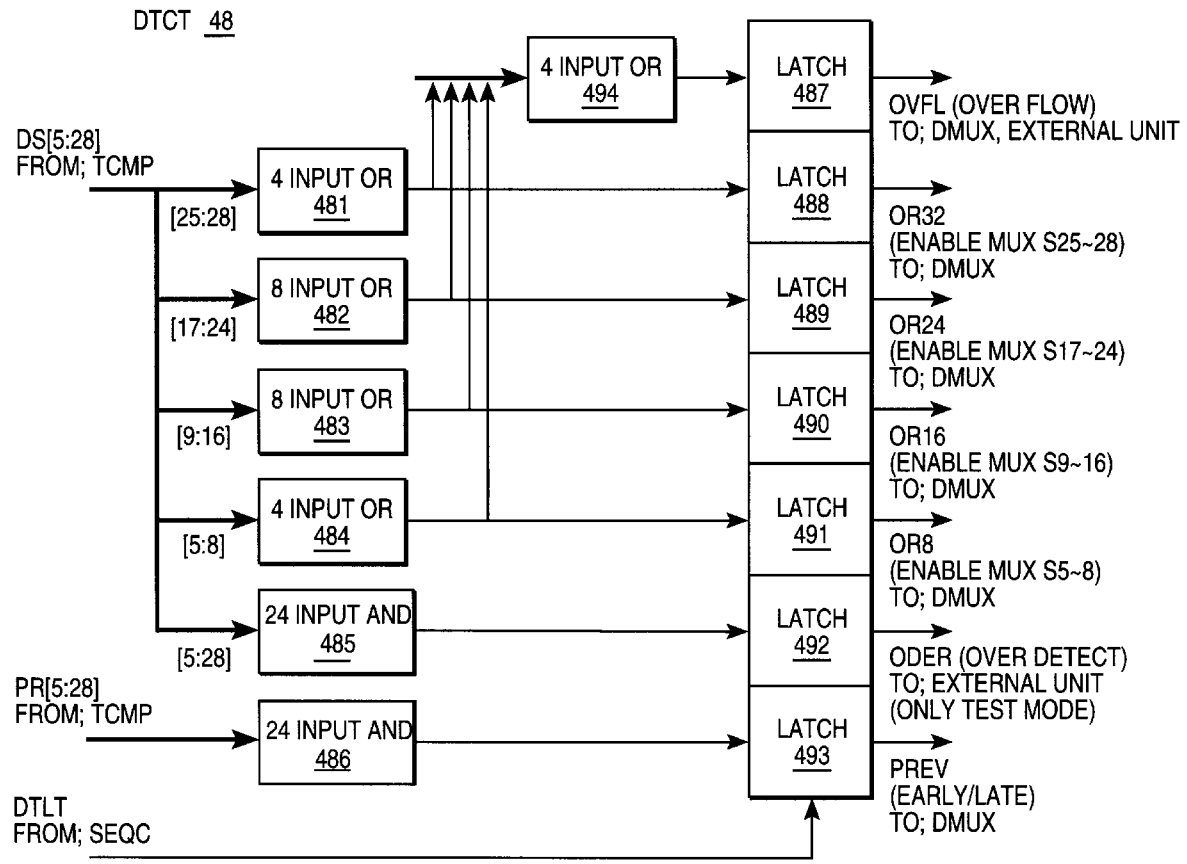
FIG_18

| 0 | 1 | 2 | 3 | 4 | 5 | 6 | 7 | 8 |
|---|---|---|---|---|---|---|---|---|
| N | T/4 | TAP | T/2 | TAP | 3T/4 | TAP | T TAP | TAP |
| 5<br>6<br>7<br>8<br>9 | <br><br><br><br>9 | X<br>X<br>X<br>X<br>34 | 10<br>12<br>14<br>16<br>18 | 18<br>24<br>2<br>4<br>6 | <br><br><br><br>27 | X<br>X<br>X<br>X<br>15 | 20<br>24<br>28<br>32<br>36 | 8<br>12<br>16<br>20<br>24 |
| 10<br>11<br>12<br>13<br>14 | 10<br>11<br>12<br>13<br>14 | 39<br>44<br>1<br>2<br>3 | 20<br>22<br>24<br>26<br>28 | 8<br>10<br>12<br>14<br>16 | 30<br>33<br>36<br>39<br>42 | 18<br>21<br>24<br>27<br>30 | 40<br>44<br>48<br>52<br>56 | 28<br>32<br>36<br>40<br>44 |
| 15<br>16<br>17<br>18<br>19 | 15<br>16<br>17<br>18<br>19 | 4<br>5<br>6<br>7<br>8 | 30<br>32<br>34<br>36<br>38 | 18<br>20<br>22<br>24<br>26 | 45<br>48<br>51<br>54<br>57 | 33<br>36<br>39<br>42<br>45 | 60<br>64<br>68<br>72<br>76 | 48<br>52<br>56<br>60<br>64 |
| 20<br>21<br>22<br>23<br>24 | 20<br>21<br>22<br>23<br>24 | 9<br>10<br>11<br>12<br>13 | 40<br>42<br>44<br>46<br>48 | 28<br>30<br>32<br>34<br>36 | 60<br>63<br>66<br>69<br>72 | 48<br>51<br>54<br>57<br>60 | 80<br>84<br>88<br>92<br>96 | 68<br>72<br>76<br>80<br>84 |
| 25<br>26<br>27<br>28<br>29 | 25<br>26<br>27<br>28<br>29 | 14<br>15<br>16<br>17<br>18 | 50<br>52<br>54<br>56<br>58 | 38<br>40<br>42<br>44<br>46 | 75<br>78<br>81<br>84<br>87 | 63<br>66<br>69<br>72<br>75 | 100<br>104<br>108<br>112<br>116 * | 88<br>92<br>96<br>100<br>104 |

X = DISABLED
* = OVERFLOW

FIG_20

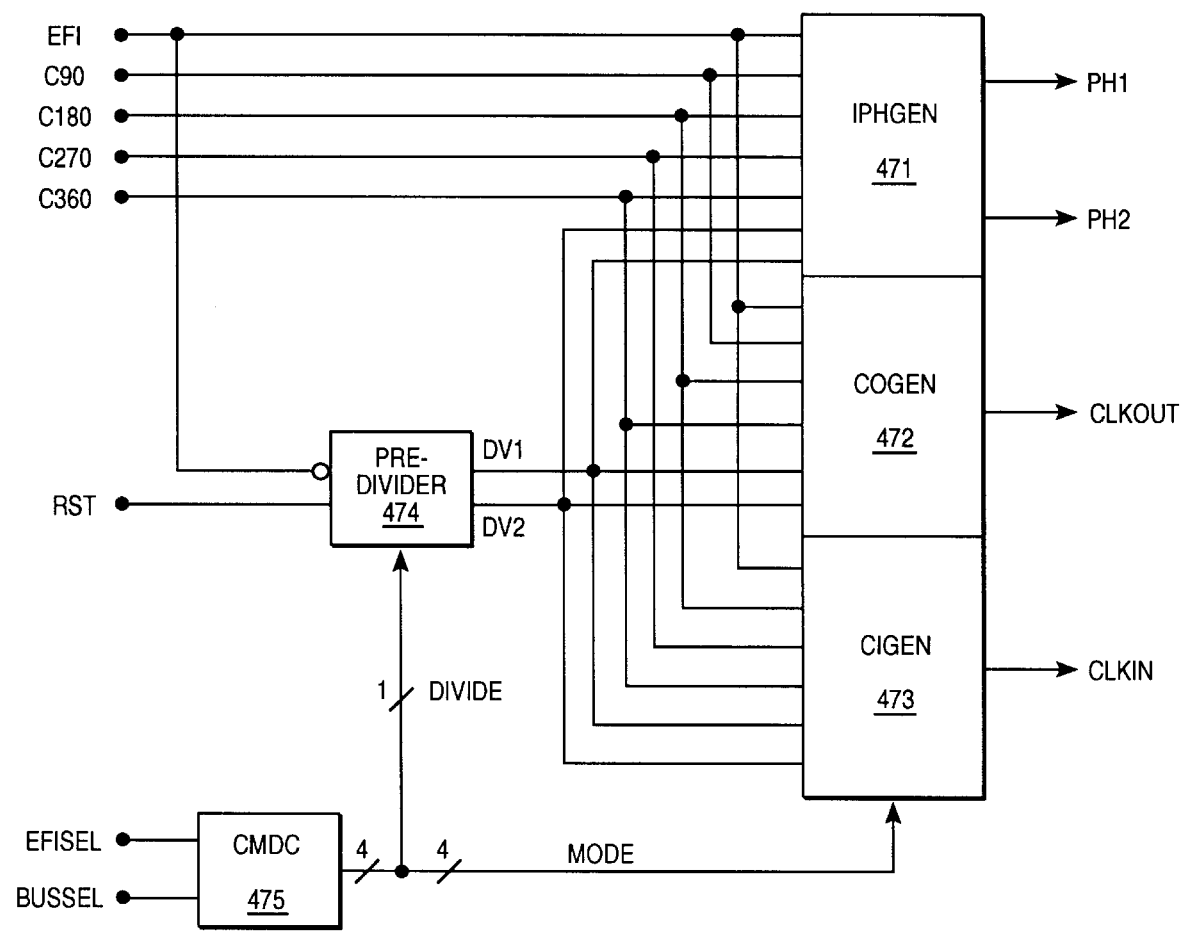
FIG_21

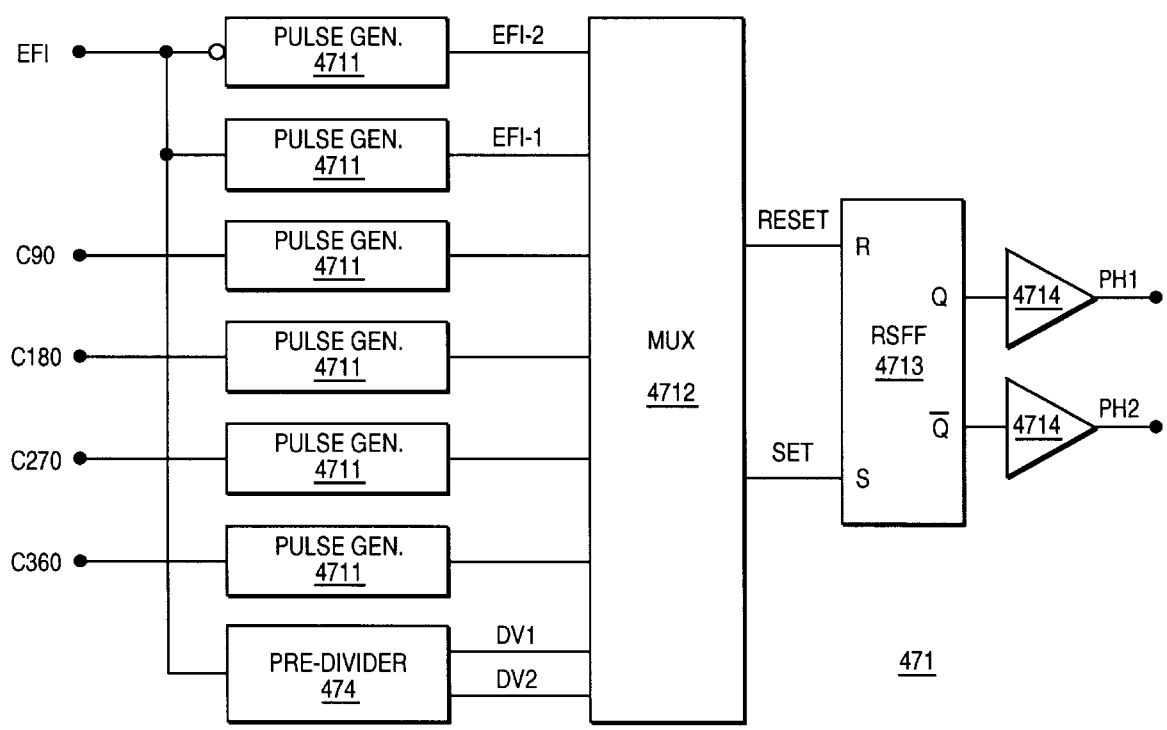
FIG_22

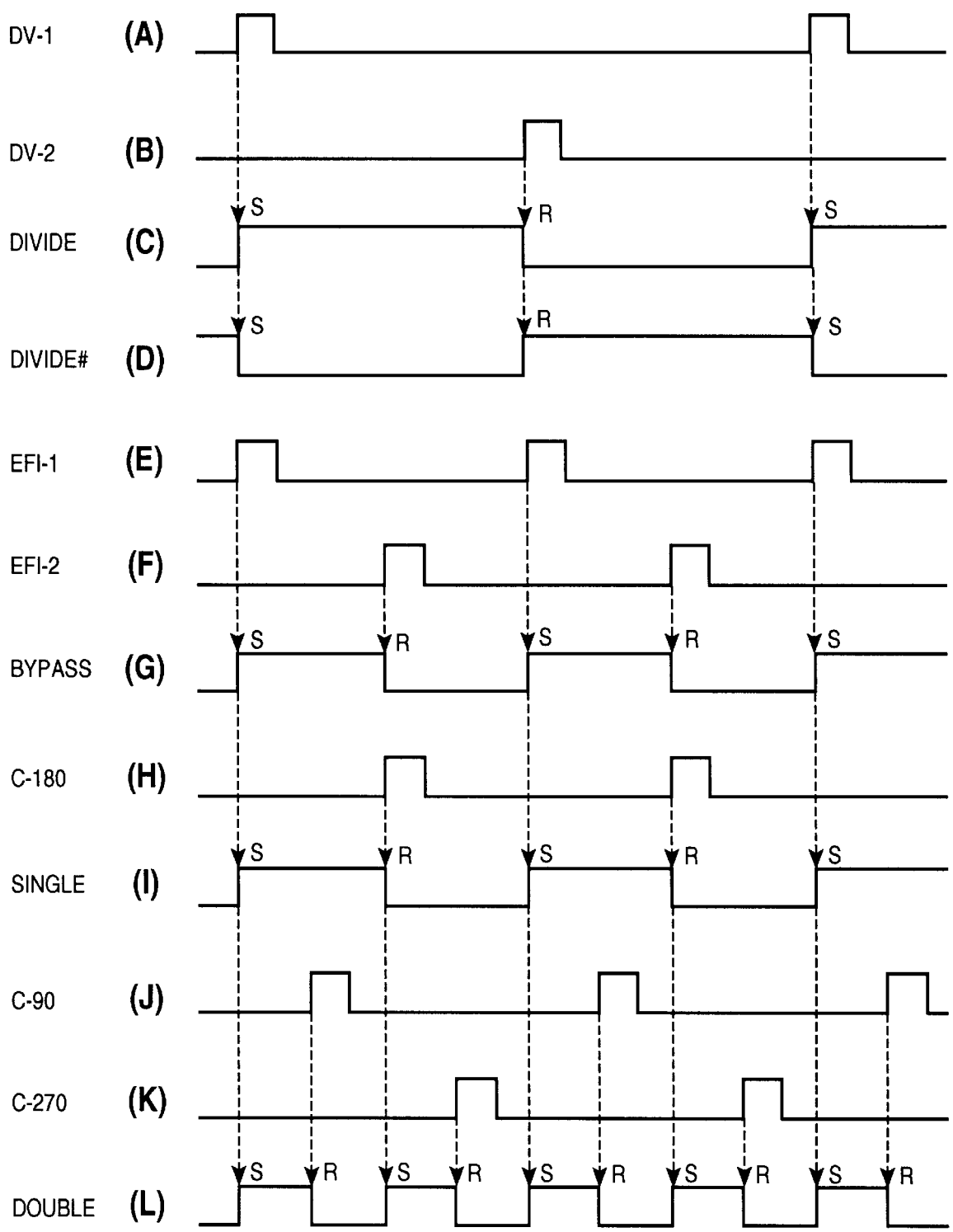
FIG_23

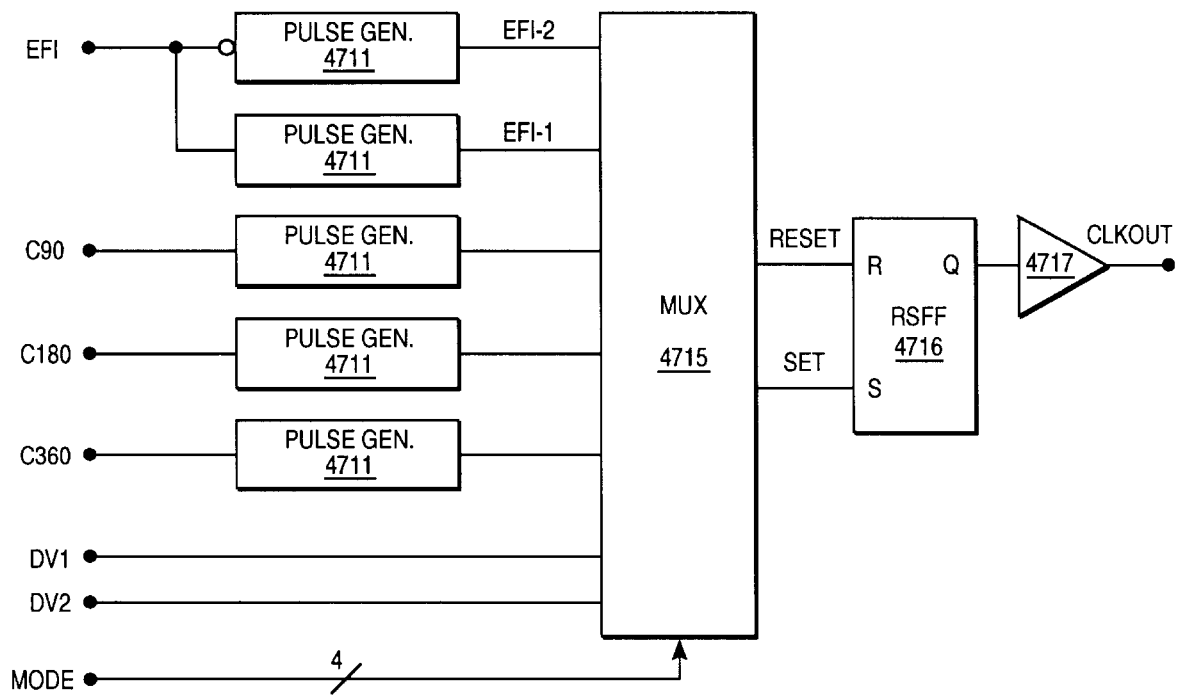
FIG_24
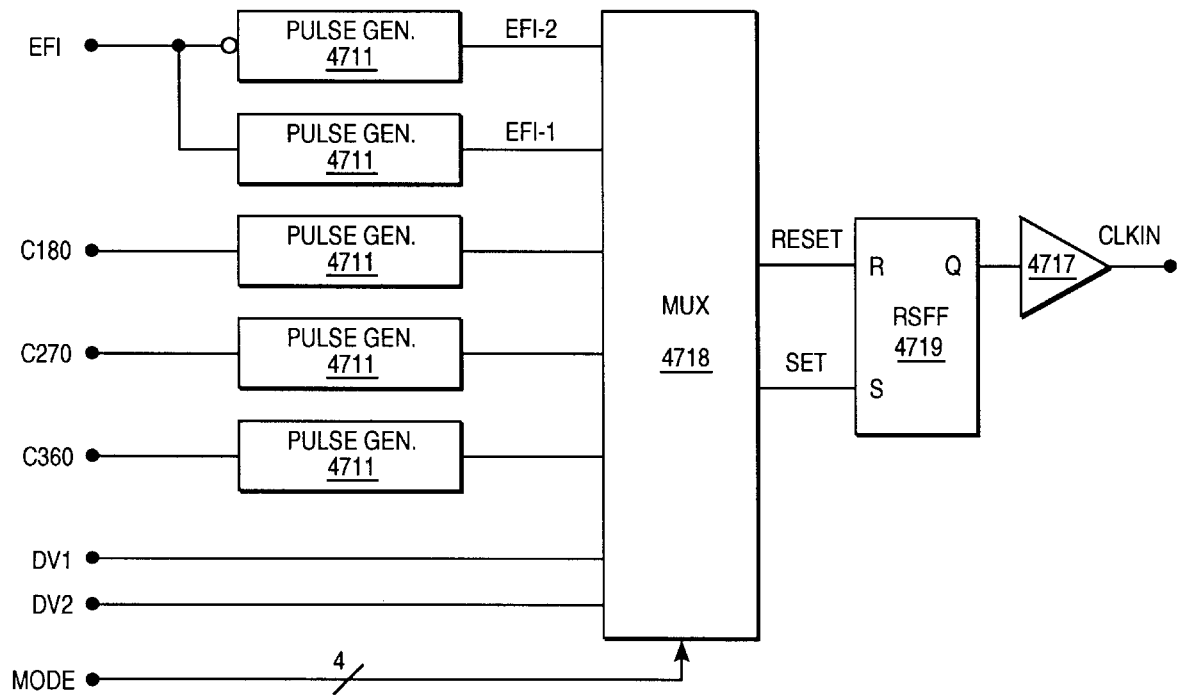
FIG_26

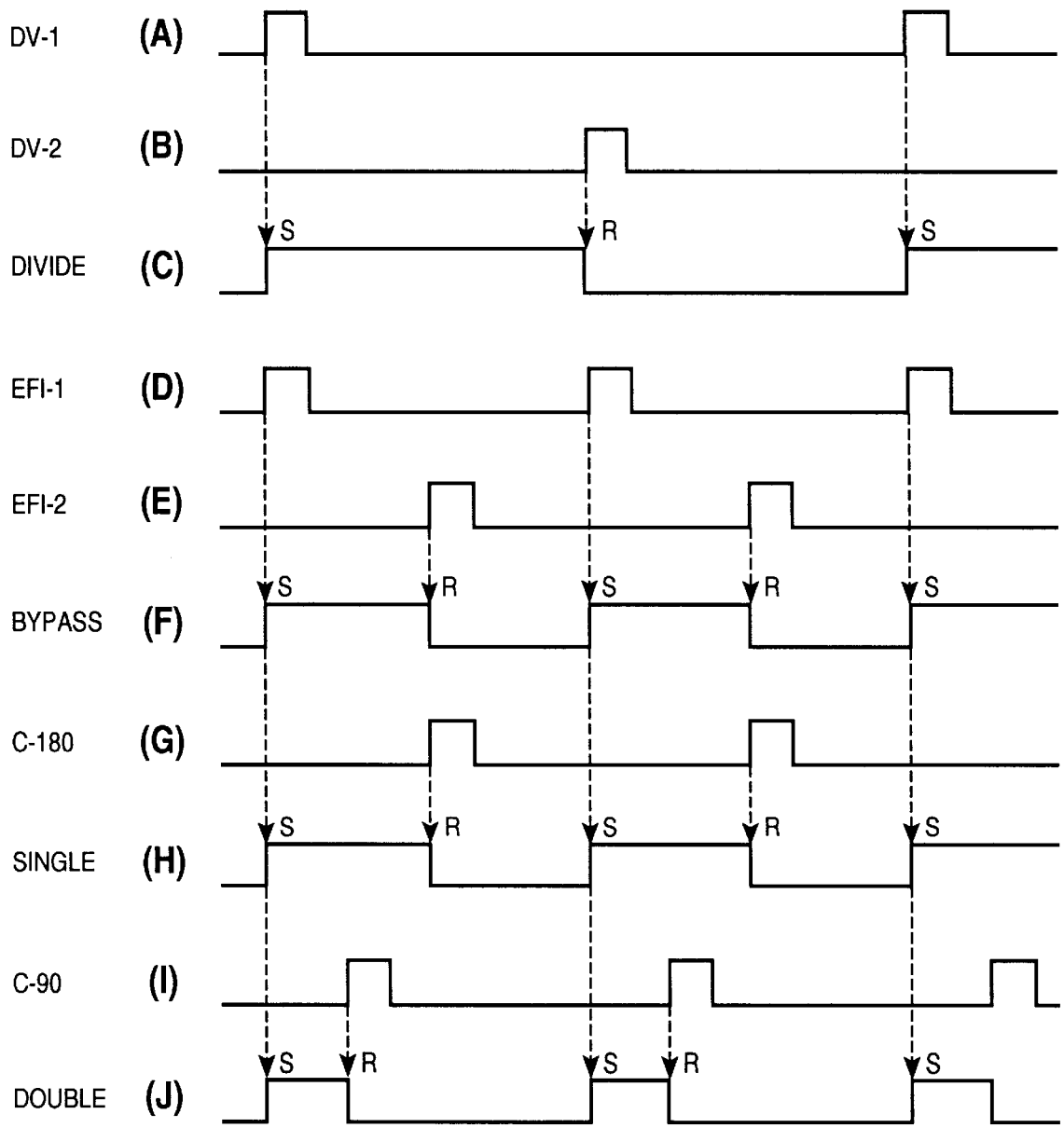
FIG_25

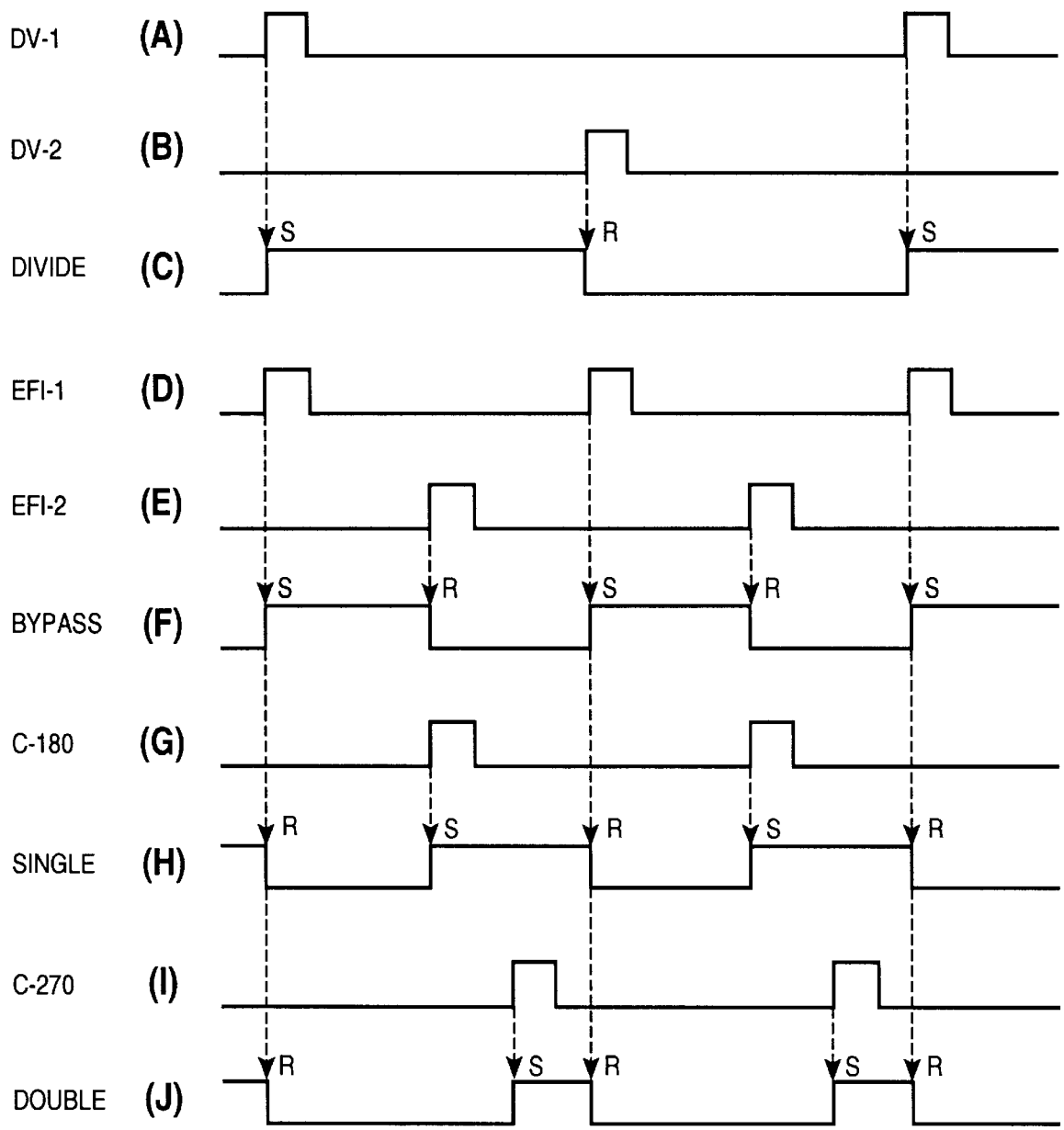
FIG_27

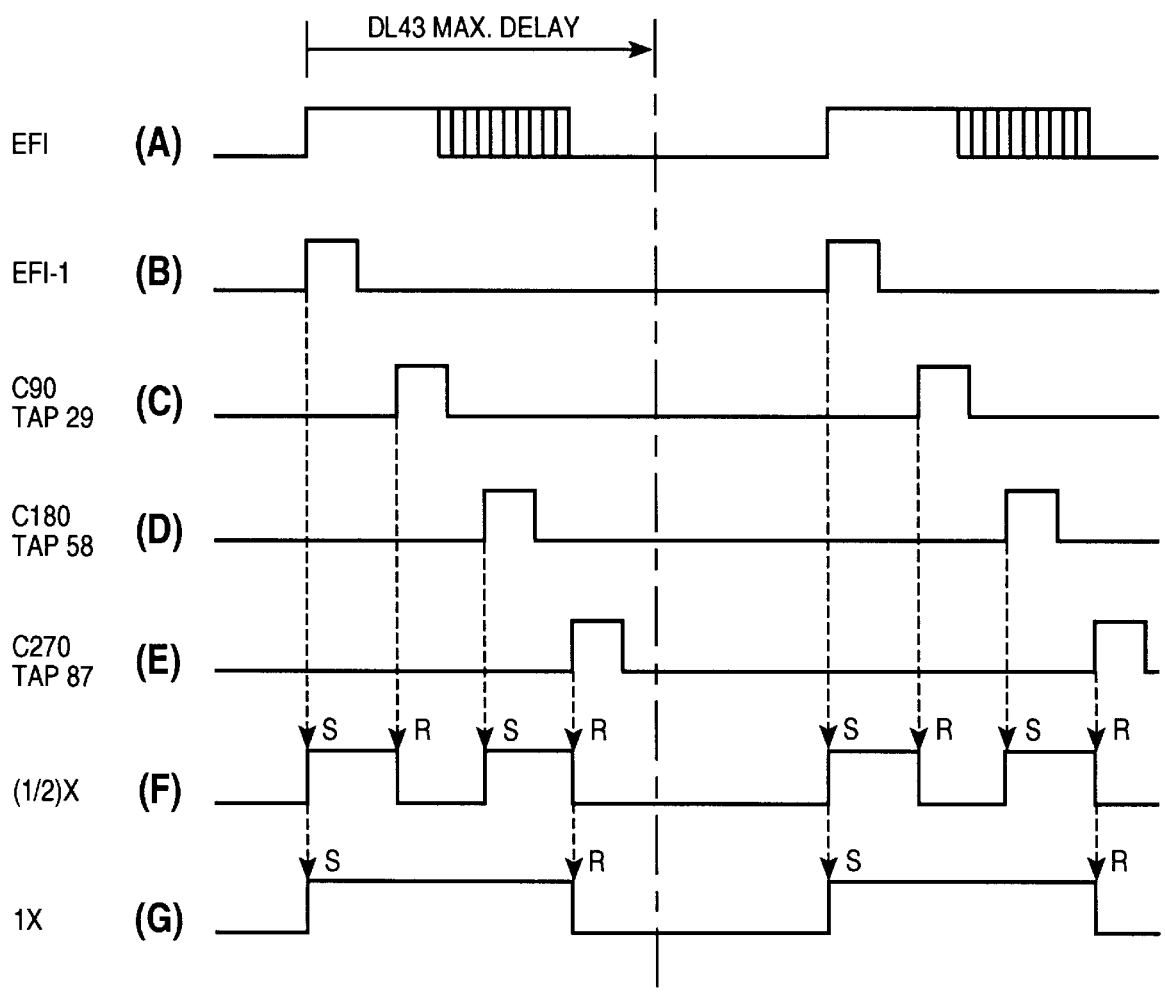
FIG_28

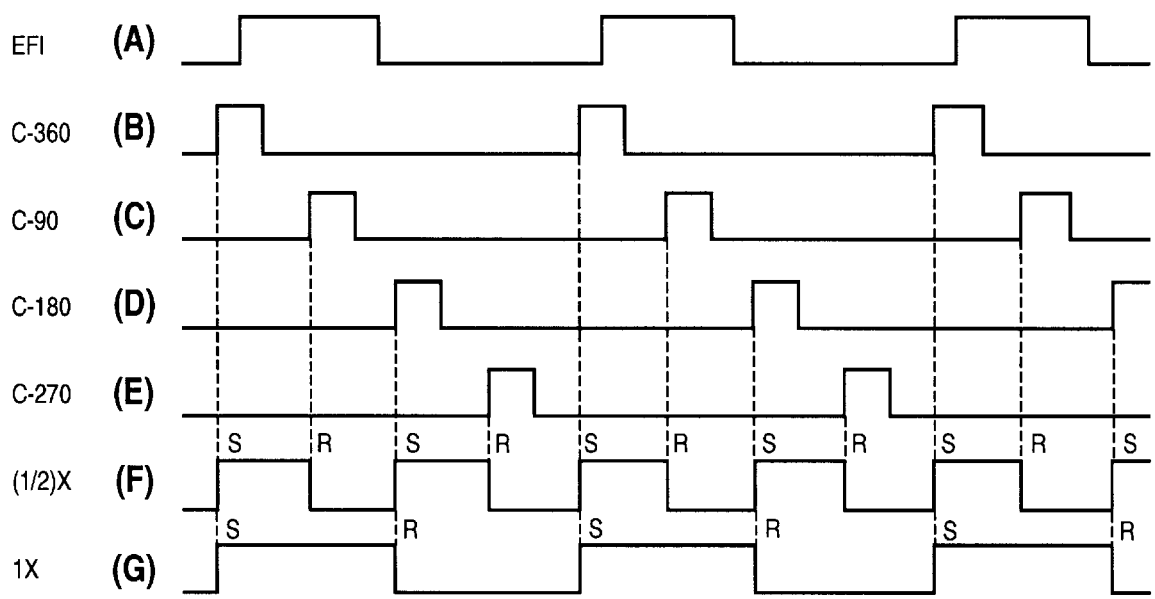
FIG_29

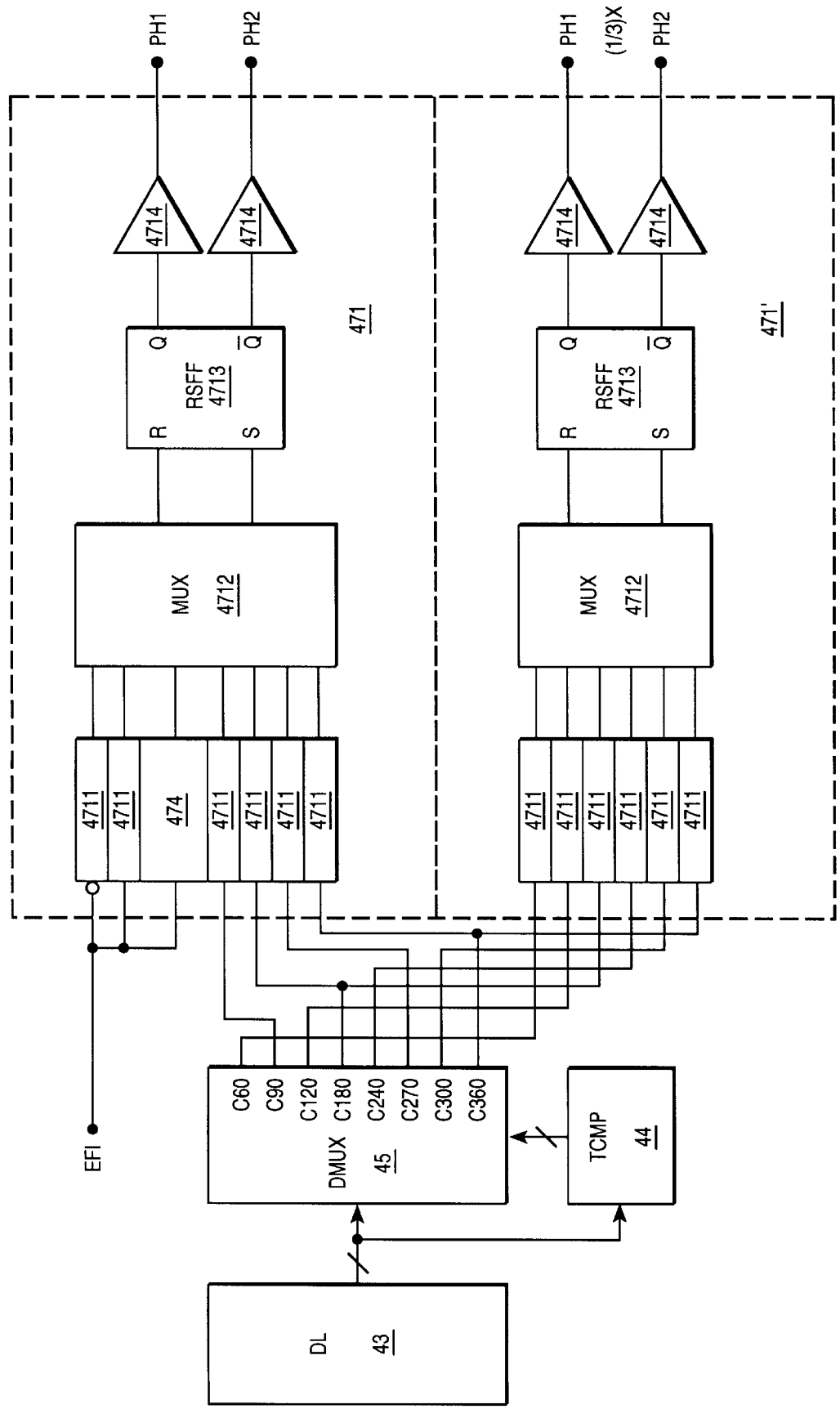
FIG_30

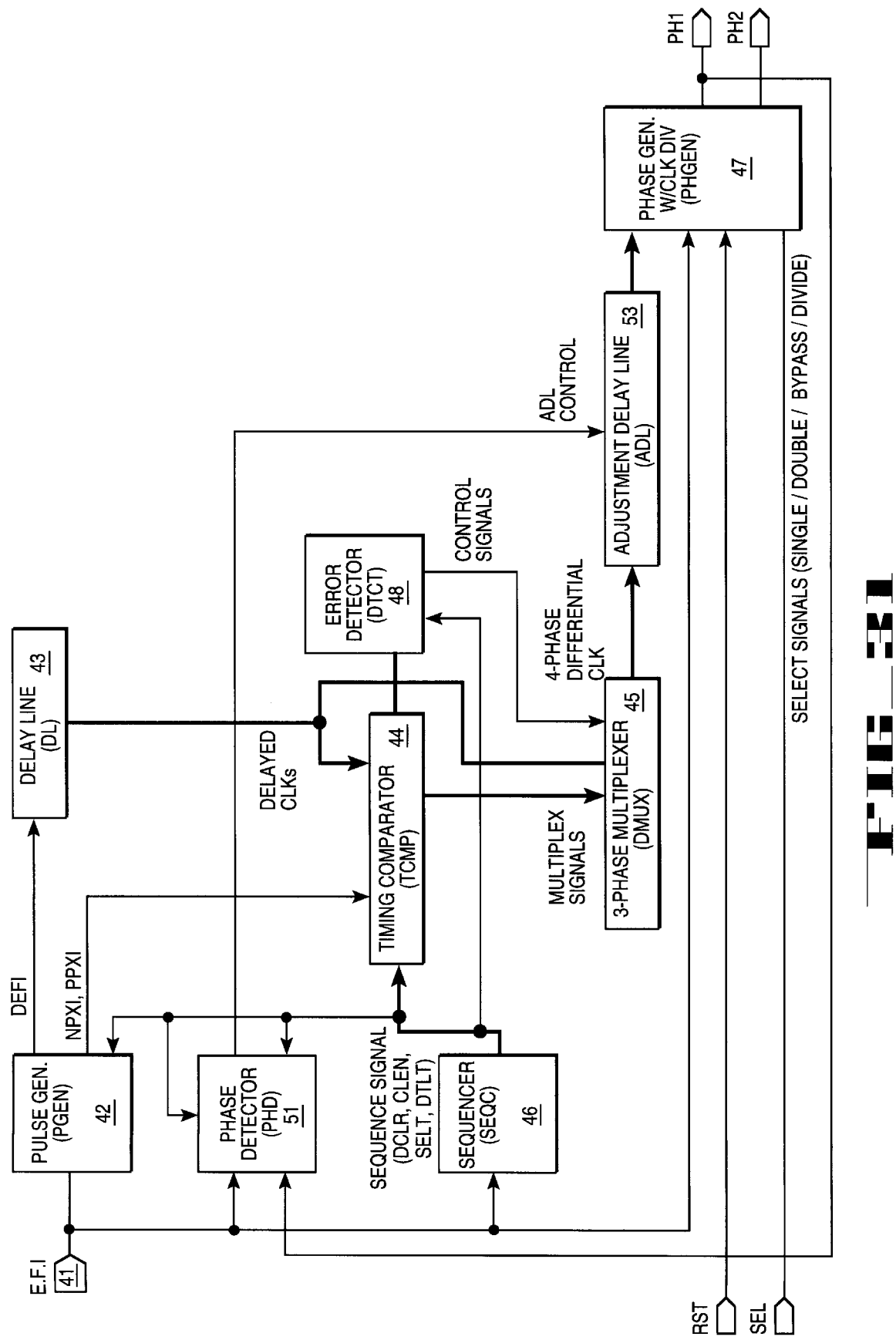

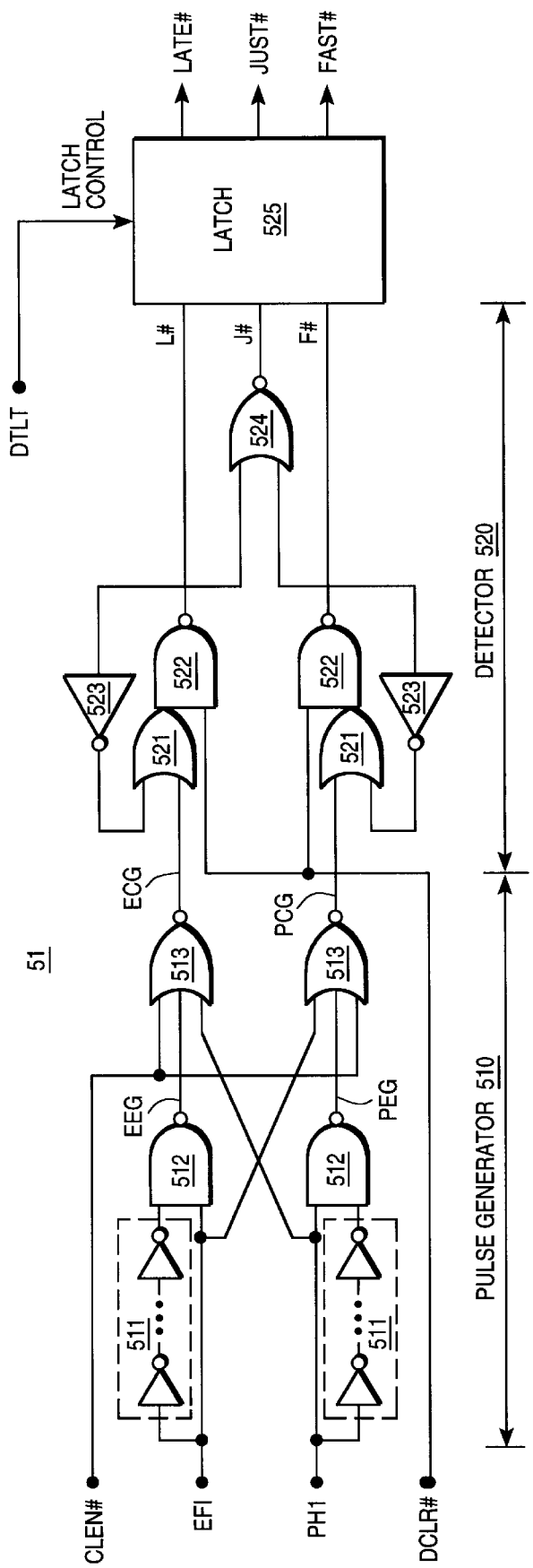
FIG_32

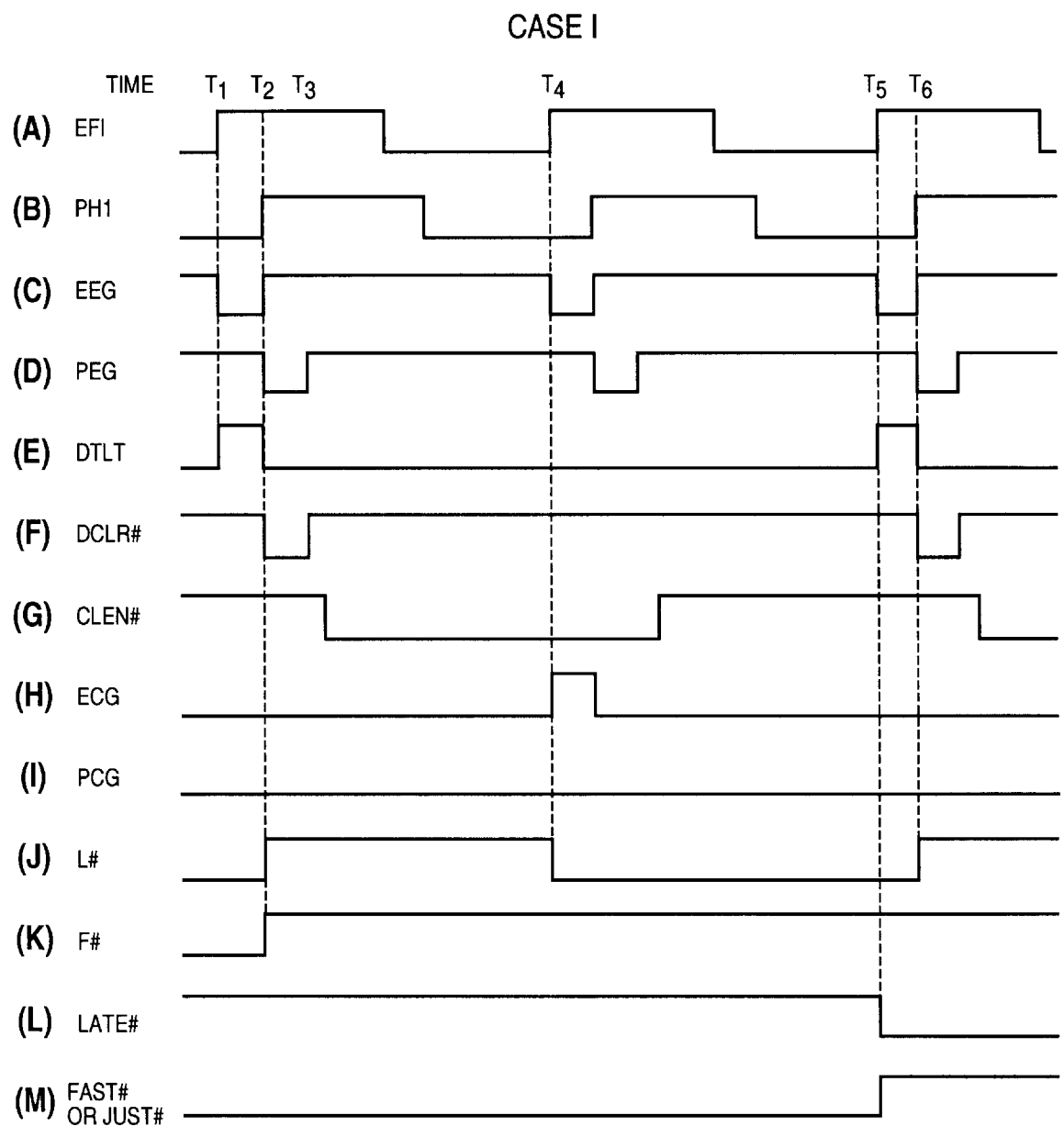
FIG_33

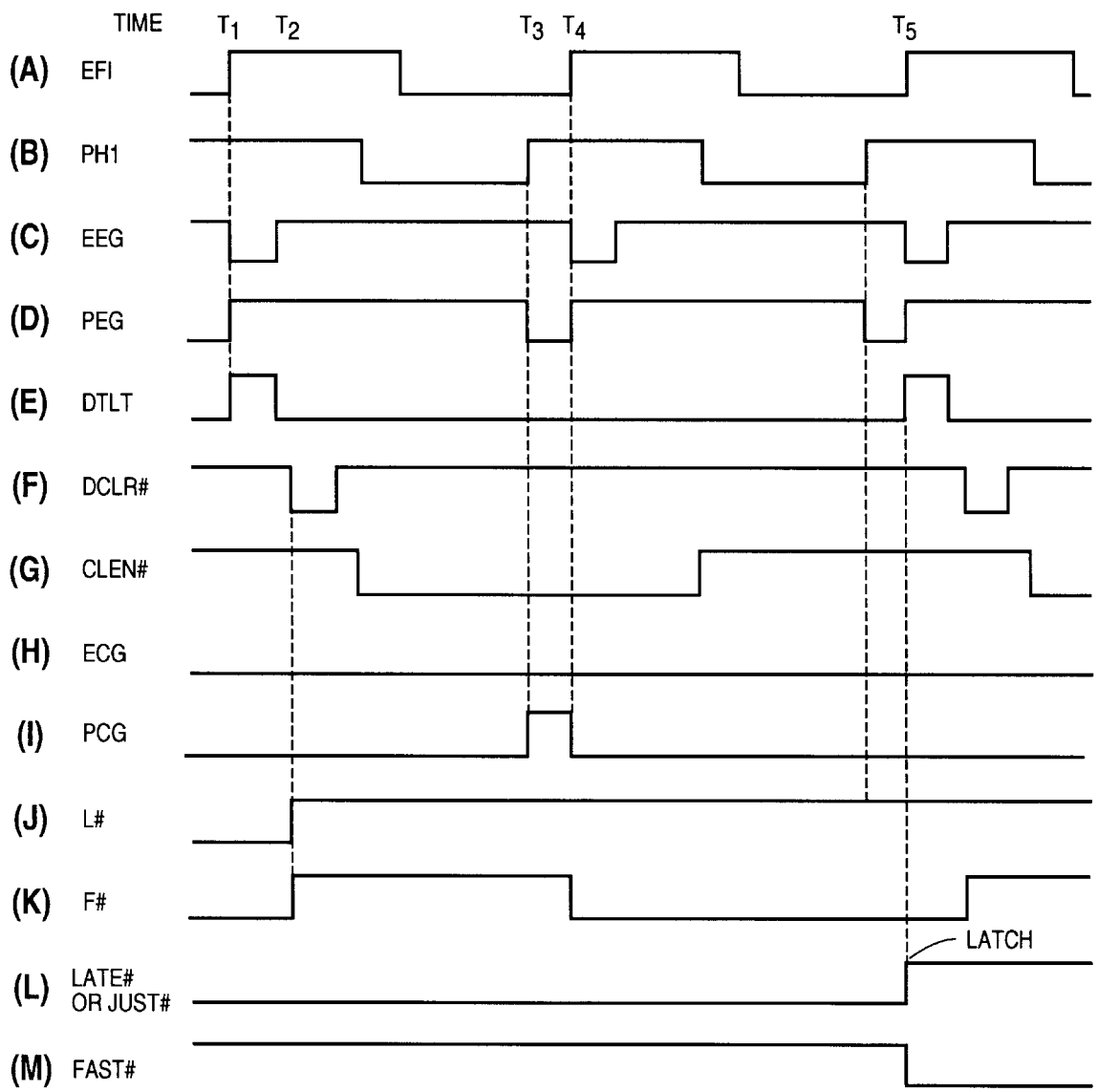
FIG_34

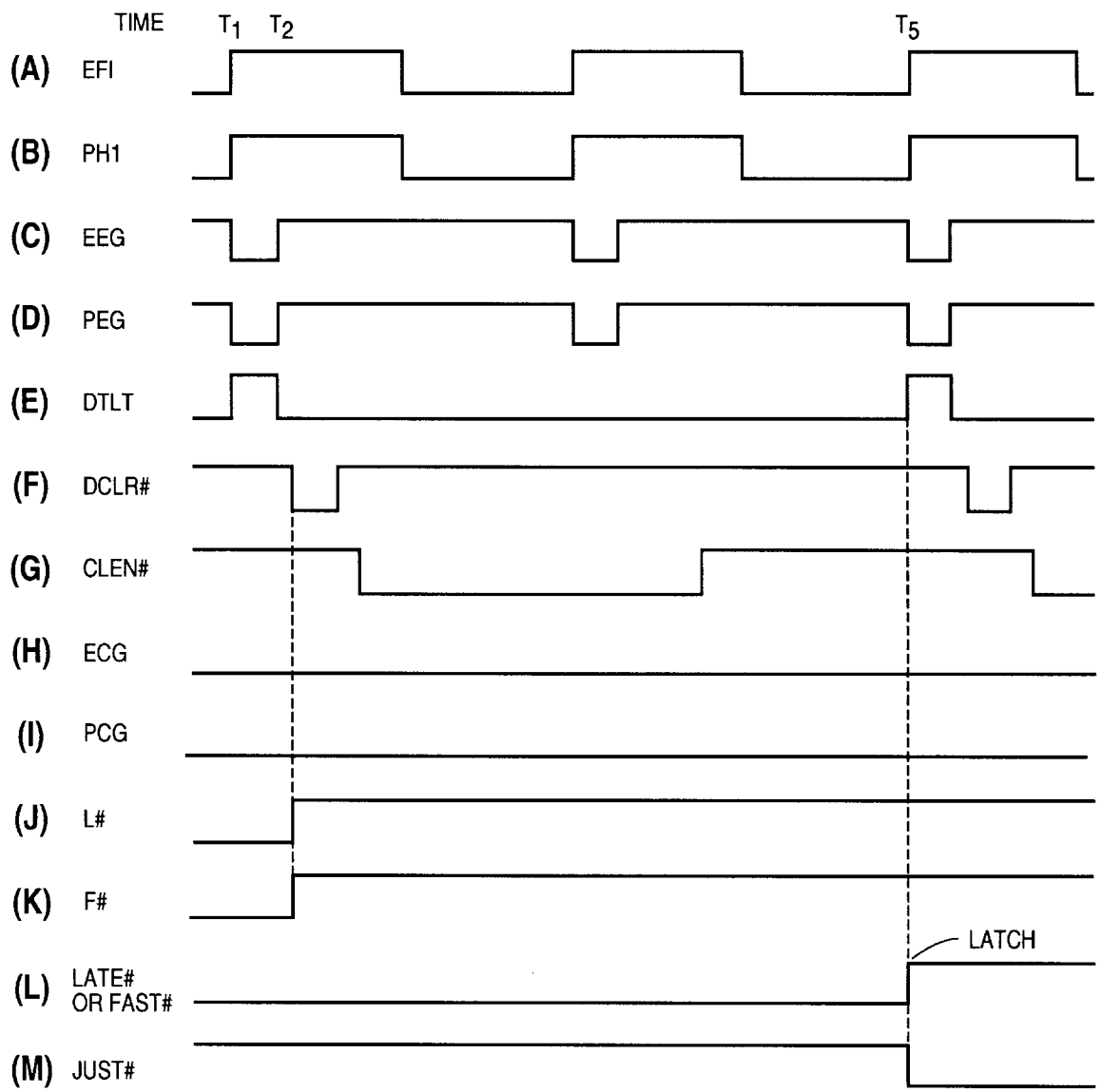
FIG_35

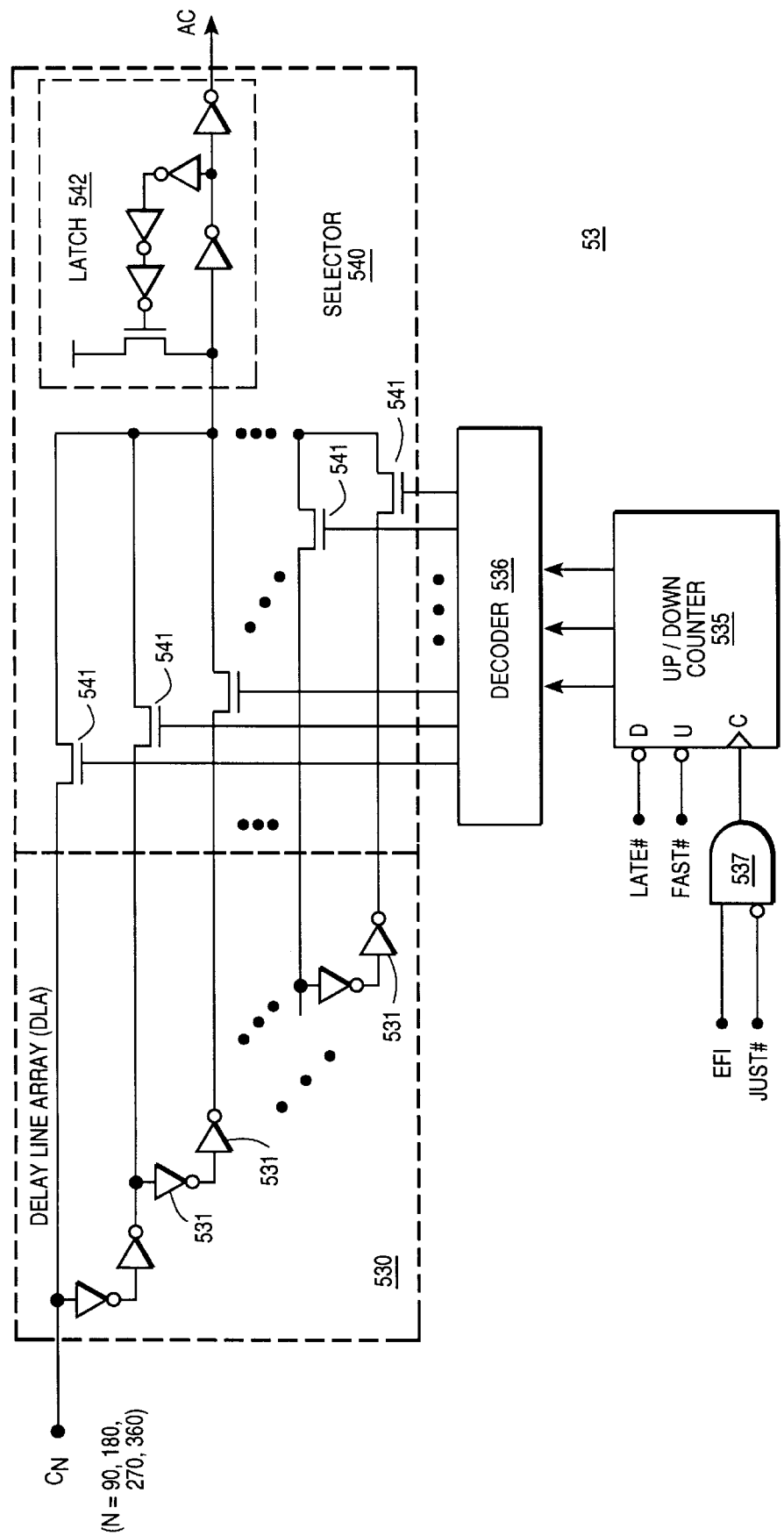
FIG_36

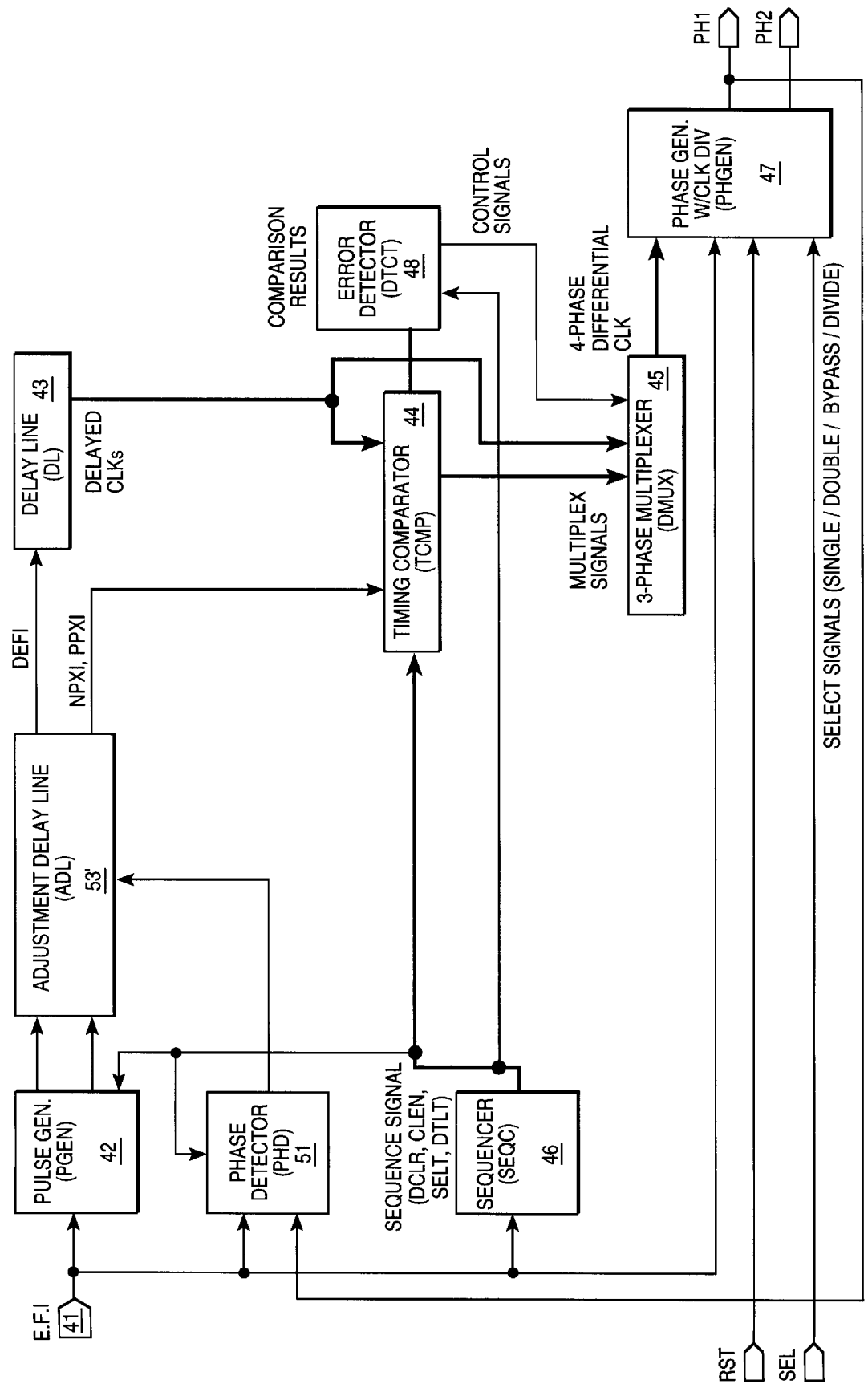
FIG_37

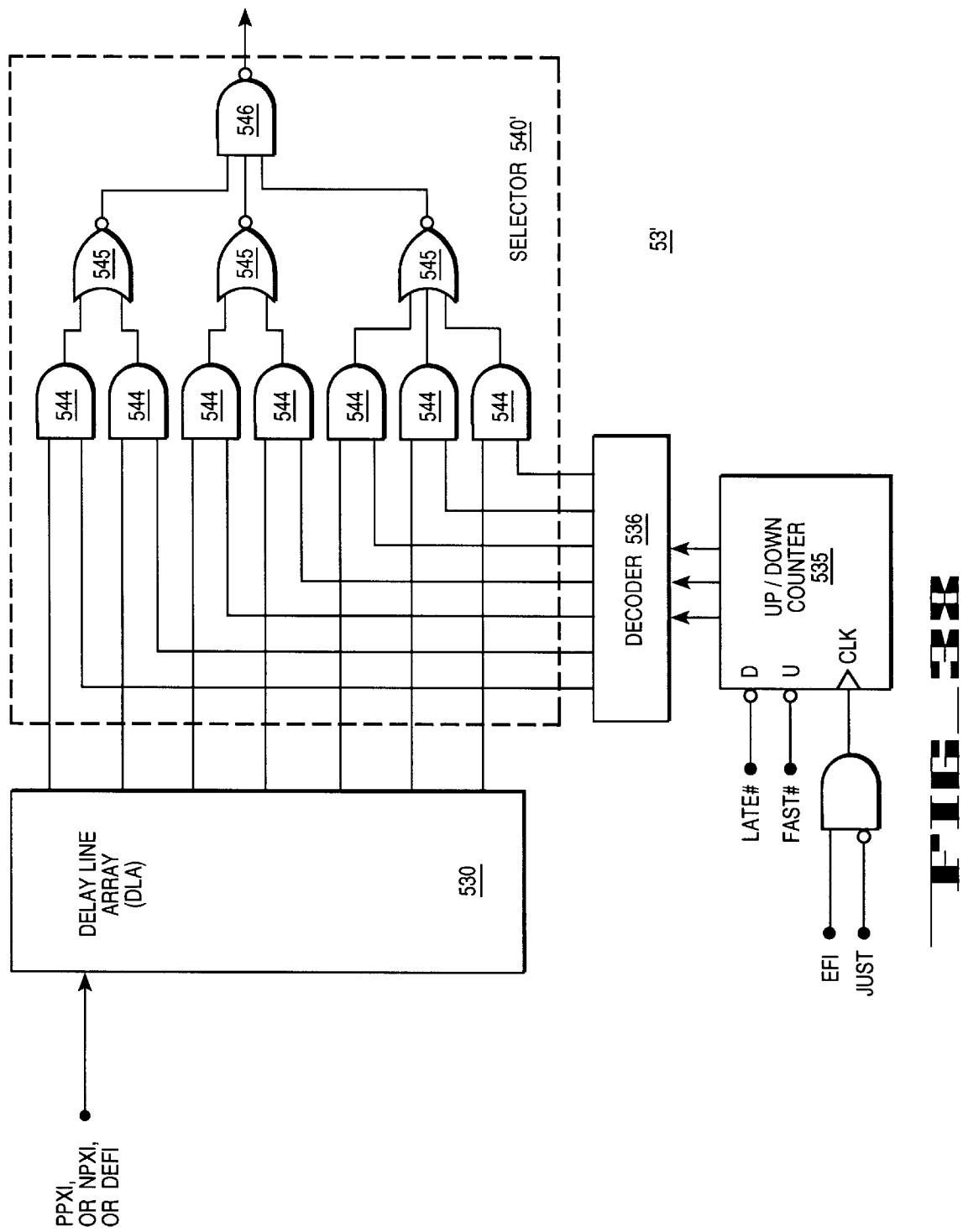

DIFFERENTIAL DELAY LINE CLOCK GENERATOR WITH FEEDBACK PHASE CONTROL

This is a continuation of application Ser. No. 08/396,119, filed Feb. 28, 1995, now abandoned, which is a continuation-in-part of a prior application Ser. No. 08/301,321, now U.S. Pat. No. 5,537,068, for "A Differential Delay Line Clock Generator," filed Sep. 6, 1994.

FIELD OF THE INVENTION

This invention relates to on-chip clock generation waveform with a 50% duty cycle from an externally supplied clock signal. The on-chip clock waveform may have a rate that is a multiple or submultiple of the external clock rate.

BACKGROUND OF THE INVENTION

The core of a modern high-speed microprocessor system, as shown in FIG. 1, includes a number of subsystems such as the microprocessor (CPU 11), secondary cache controller 12 and secondary cache memory 13. The communication between the subsystems is performed over the CPU bus 14. Highly integrated modern VLSI processes allow CPU 11 to include an on-chip primary cache 15 and floating point unit (FPU) 16. Generally, CPU 11 may include additional units that are not essential to the subject matter of this invention and are therefore omitted for clarity from FIG. 1.

Synchronous operation of the various units in the microprocessor system is accomplished by means of the clock (CLK) signal. Each unit uses the CLK signal for sequencing the operation of internal sequential logic circuits such as synchronous state machines. Inside CPU 11, CLK is generated by the clock generator circuit (CLKGEN) 17. In the past, a double frequency clock, CLK2, was used as a main system reference clock. CLK 2 consisted of a series of pulses occurring at twice the rate of the on-chip CLK.

(In the following description, commonly used clock rate nomenclature such as (½)X, 1X, and 2X will be used to indicate the clock period relative to the reference clock (1X). Hence, a (½)X clock will have twice the rate of the 1X clock and a 2X clock will have half the rate of the 1X clock.)

FIG. 2 shows a typical prior art implementation of the CLKGEN circuit 17. The frequency of the external CLK2 signal is divided by two using a D-type flip-flop (DFF) 18 with its Q# output connected to its D input. Clock driver (CLKDRV) 19 provides a buffered output CLK with a 50% duty cycle, independent of the duty cycle of CLK 2.

At the higher clock rates of modern microprocessors (50 to 100 MHz), the distribution of a CLK 2 signal with a 100 to 200 MHz rate presents difficult design problems due to the complexity that requires substantial skills in high frequency analog techniques. Also, simple circuits, such as CLKDRV 19, have delays of 2 to 3 ns which are significant when compared with the periods of 50 to 100 MHz clocks. The use of 1X external clock is precluded by the need to generate a 50% duty cycle on-chip clock. In fact, it would be preferable to use an external clock with a one-half rate (2X) for reduced distribution problems if a 1X clock signal with a 50% duty cycle could be readily generated on-chip.

Phase-locked-loop (PLL) circuits have been employed to multiply clock rates for producing 50% duty cycle clock waveforms. Two problems are encountered with the PLL approach: analog circuits are required; and long lock-on times are required for synchronization.

Analog circuits, when included on the same substrate as digital circuits, encounter severe noise problems due to digital "switching" of signals. Also, because of the higher supply voltage (Vcc) required for analog CMOS circuitry, PLL implementation in modern low voltage (1.5V) CMOS (complementary initial-oxide semiconductor) would be manufacturing process incompatible.

FIG. 3 shows a typical prior-art PLL clock generator for producing a CLK signal with 50% duty cycle and 1X rate. The use of a sequential phase-frequency detector (PFD 20) and charge-pump (CP 21) as elements in the PLL results in zero skew between CLK and CLKEFI. Low-pass filter (LPF 22) smoothes the output of CP 21 before applying the control signal to VCO 23. The 50% duty cycle obtains by using the voltage controlled oscillator (VCO 23) oscillating at twice the CLKEFI frequency and then dividing the clock rate by two using frequency divider network 24. The output of divider network 24 (CLK) is applied to PFD 20 via CLKDRV 25 for comparison with CLKEFI.

A delay line loop (DLL) on-chip clock circuit has been implemented using CMOS circuitry and is described by Waizman in U.S. Pat. No. 5,317,202 for "A Delay Line Loop for 1X On-Chip Clock Generation with Zero Skew and 50% Duty Cycle." The DLL is a digital circuit implementation that eliminates the analog circuitry of the PLL. However, because of the closed loop control used in both the DLL and PLL method, long stabilization times are required for resynchronization.

FIG. 4 is a simplified block diagram of a 1X, 50% duty cycle DLL clock generator comprising a CLK waveform generator loop 204 and a delay line (DL) control loop 30. The DL control loop 30 controls the delay elements in the inverting voltage control delay line (IVCDL 32) to ensure a delay of one-half the period of CLKEFI by comparing the output (CLK) with CLKEFI. CLK waveform generator loop 31 operates by using the onset of CLKEFI to form the leading edge of the CLK waveform in waveform generator 34 which is applied to IVCDL 32. One-half period later, the inverted onset of CLK appears at the output of IVCDL 32 as the half-period transition of CLK which is feedback to waveform generator 300 for synthesizing the second half of the CLK period waveform. The necessary filters in both feedback loops result in long settling time when resynchronization is required.

SUMMARY AND OBJECTS OF THE INVENTION

It is an object of the invention to provide an on-chip clock generator that is implementable in CMOS operating at low voltages.

It is another object to provide an on-chip clock generator with a fast resynchronization time with changes in supply voltage or input clock rate.

It is also an object to provide an on-chip clock generator capable of generating an on-chip clock rate that is either one-half, the same, or twice the external clock rate and having a 50% duty cycle.

It is a further an object to provide a 50% duty cycle on-chip clock, with a rate that is a multiple or submultiple of an external clock signal by using a tapped delay-line with small differential time-delays between taps.

Another object is to provide an all digital implementation of a clock generator that does not require analog type circuits.

A tapped delay-line is used to synthesize a 50% duty cycle clock waveform from an externally supplied clock signal in a feed-forward circuit configuration. The synthesized clock waveform may have a clock rate of one-half, the same, or twice the externally supplied clock. The feedforward portion, an open-loop configuration with small differential delays between delay-line taps, is absolutely stable and provides a stable output clock within six clock cycles when operating at up to 100 MHz clock rate. Overall feedback is provided for reducing the effects of changes in the feedforward portion due to aging and environmental causes.

BRIEF DESCRIPTION OF THE DRAWINGS

The present invention is illustrated by way of example and not limitation to the figures of the accompanying drawings, in which like references indicate similar elements and in which:

FIG. 1 is a block diagram of a modern high speed microprocessor system.

FIG. 2 is a prior art divide-by-two CLK generator circuit including a waveform timing diagram of the input and output lock signals.

FIG. 3 is a prior art PLL circuit for 1X clock generation.

FIG. 4 is a block diagram of a DLL 1X clock generator with 50% duty cycle.

FIG. 5 is a block diagram of a DDL circuit for generating a ½X, 1X, or 2X CLK waveforms.

FIG. 6 shows a set of typical DDL waveforms.

FIG. 7 is logic schematic for the pulse generator (PGEN).

FIG. 8 shows PGEN waveforms.

FIG. 9 shows the sequencer (SEQC) waveforms.

FIG. 11 shows odd (DO) and even (DE) DL tap waveforms.

FIG. 12 is a block diagram of the timing comparator (TCMP).

FIG. 15 is a set of TCMP unit waveforms.

FIG. 16 is a truth table summarizing the logic of the TCMP unit.

FIG. 17 is a functional block diagram for the error detector (DTCT).

FIG. 18 is a schematic for the differential clock multiplexer (DMUX).

FIG. 19 is a table for determining PL tap connections for ¼, ½, ¾, and one period delays.

FIG. 20 is a functional block diagram for the phase generator (PHGEN).

FIG. 21 is a functional block diagram for the internal phase generator (IPHGEN).

FIG. 22 shows the order of multiplexing for IPHGEN.

FIG. 23 shows a block diagram for the clock-out generator (COGEN).

FIG. 24 shows the order of multiplexing for COGEN.

FIG. 25 is a functional block diagram for the clock-in generator (CIGEN).

FIG. 26 shows the order of multiplexing for CIGEN.

FIG. 27 shows the waveforms associated with the predivide unit of PHGEN.

FIG. 28 shows the PHGEN waveforms generated at overflow.

FIG. 29 shows early clock PHGEN output waveforms.

FIG. 30 shows a differential delay line (DDL) clock generator with an added PHGEN.

FIG. 31 shows a differential delay line (DDL) clock generator with feedback compensation.

FIG. 32 shows a logic diagram for a phase detector suitable for use in the DDL clock generator with feedback.

FIG. 33 shows a Case I set of waveforms associated with the DDL clock generator of FIG. 31.

FIG. 34 shows a Case II set of waveforms associated with the DDL clock generator of FIG. 31.

FIG. 35 shows a Case III set of waveforms associated with the DDL clock generator of FIG. 31.

FIG. 36 shows a variable delay network for use in a DDL clock generator with feedback compensation.

FIG. 37 shows another implementation of a DDL clock generator with feedback compensation.

FIG. 38 shows a feedback controlled adjustment delay line (ADL) suitable for use in the DDL clock generator of FIG. 37.

DETAILED DESCRIPTION

A. Overview

Figure 10:
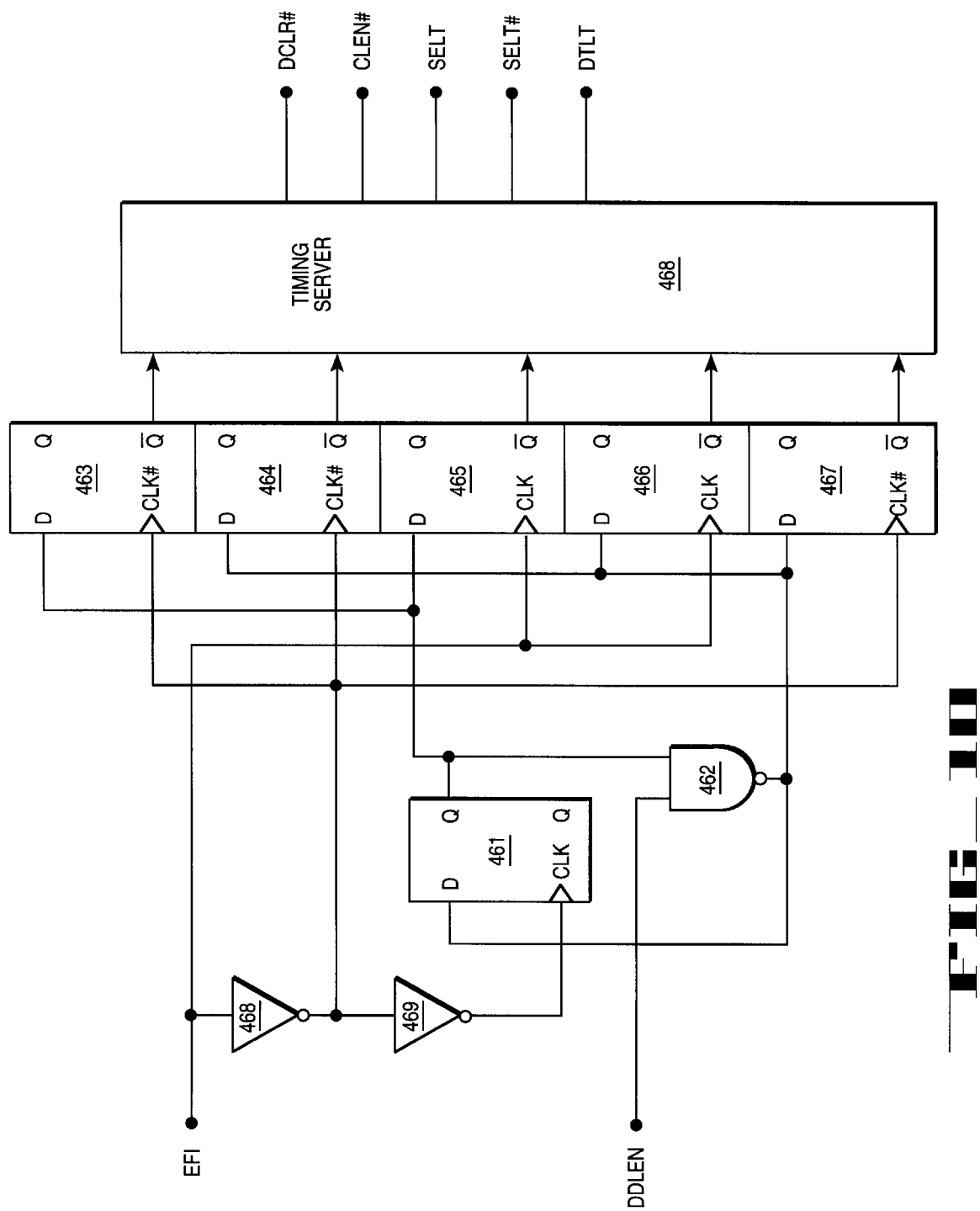
FIG. 10 shows the DDL tapped delay line (DL).

FIG. 5 is a block diagram of the basic DDL clock generator comprising: input terminal 41 for accepting an external clock signal (EFI); pulse generator (PGEN) 42 for generating a delayed image of EFI that is applied to delay line (DL) 43 and generating control signals NPXI and PPXI that are applied to timing comparator (TCMP) 44; DL 43, in one embodiment, has 112 differential delayed clocks that are applied to TCMP 44 and to DMUX 45. TCMP 44 using control signals provided by PGEN 42 and sequencer (SEQC) 46 provides control signals to 3-phase multiplexer (DMUX) 45 for selecting the proper set of delayed clocks generated by DL 43 for output to phase generator (PHGEN) 47; sequencer (SEQC) 46 generates a set of sequencing signals for control of TCMP 44; phase generator (PHGEN) 47 produces a set of internally useful (on-chip) clock signals on output terminals PH1, PH2, CLKIN, and CLKOUT, the operating mode determined by externally supplied signals (SEL) for selecting single clock rate, double clock rate, bypass or divide mode.

The differential taps of DL 43 provide a set of images of DEFI each differentially delayed by a uniform interval relative to the preceding tap so that the total delay of the 112 taps exceeds the period of EFI by a small fraction. For example, the 100th tap may correspond to an EFI period so that the outputs of taps 25, 50, and 75 would respectively correspond to samples of the clock at ¼, ½, and ¾ of EFI (or equivalently at 90°, 180°, and 270° of a full cycle of 360°). Using these values sampled by DMUX 45, PHGEN 47 can synthesize a number of internally useful clock signals.

FIG. 6, for clarity, shows a set of operating waveforms, (a) through (o), corresponding to a simplified DL 43 having eight taps with differential delays of ⅛ period. Reference clock EFI, is shows on line (a). DL 43 sequential tap outputs are shown in lines (b)–(h) for taps 0–6 and on line (i) for tap 0 again. (Tap 7 output is omitted for clarity because it is not required for the synthesis.) The clock waveforms synthesized at the output of PHGEN 47 are shown on lines (j)–(o). The rising edges of waveforms from taps 0, 2, 4, and 6 are used to synthesize the six waveforms shown in lines (j) through (o) as indicated by the dotted lines and arrows. The resulting waveforms are synchronous with the leading (rising) edge of EFI as shown on line (a).

B. Detailed Description
B.1 Pulse Generator (PGEN 42)

FIG. 7 is a simplified circuit for PGEN 42 of FIG. 5. Two input terminals are provided for accepting external clock EFI and control logic signal CLEN# from SEQC 46. Delay unit 60 is applied to EFI to produce delayed EFI (DEFI) by delaying EFI by T0 seconds. DEFI is applied to an input of NAND gate 62 and another delay is applied by delay unit 62 to produce DEFI1, corresponding to EFI delayed by T1 seconds, which is applied to an inverting input of NAND gate 62. Waveforms EFI, DEFI, and DEFI1# are shown in FIG. 8, lines (a), (b) and (c), respectively. The output of NAND gate 62 is shown on line (d). Logic control signal CLEN#, together with the output of NAND gate 62, is applied to OR-gate 64 for producing the positive reference pulse signal PPXI as shown on line (f). Similarly, EFI is applied to the inverting input of NOR-gate 63 and DEFI1 is applied to the other input of NOR-gate 63 whose output, together with CLEN#, is applied to OR-gate 65 to produce NPXI, the negative reference pulse signal.

It will be recognized that an actual implementation may vary from that shown in FIG. 7 because of the fine timing adjustments required at these high clock rates. These fine timing adjustments are not shown in FIG. 7 because they are specific to each particular circuit implementation and are introduced by those practicing the art where required by the circuit components and layout being used.

B.2 Sequencer (SEQC 46)

SEQC 46 generates signals for controlling all tasks in the DDL clock generator. These control signals have a 2-clock cycle as shown in FIG. 9 and are defined below. (In all of the following description the symbol # represents the logical complement of the signal to which it affixed.)

- SELT: one shot pulse occurring immediately after the 0-EFI clock pulse onset of FIG. 9, of sufficient duration to enable the Sn latches of TCMP 44, and occurring before DCLR# and CLEN# but after NPXI and PPXI.
- SELT#: the logical complement of SELT.
- DTLT: one shot pulse for enabling the error status latches of DTCT 48, including PREV, ORn, OVFL, and ODER.
- DCLR#: one shot pulse for clearing TCMP 44, occurring after SELT, and having a duration of at least one inverter delay plus one complex gate delay.
- CLEN#: asserted low immediately after DCLR# is inactive (high), and remains low for one EFI period plus 0.5 ns.

FIG. 10 is a block diagram of SEQC 46. The circuit is enabled by control signal DDLEN being applied to NAND-gate 462 and thereby completing the connection between the Q output and the D input of D-type flip-flop 461, causing the flip-flop to act as a frequency divide-by-two network, dividing the EFI clock provided through inverters 468 and 469. The Q output of flip-flop 461 supplied to the D inputs of D-type flip-flop latches 463 and 465. Latches 464, 465 and 467 have their D input connected to the Q output of flip-flop 461 after inversion by NAND gate 462. Latches 463, 464 and 467 have inverting clock (CLK#) inputs to the inverted EFI signals out of inverter 468. Latches 465 and 466 are clocked directly by EFI. The contents of latches 463–467 are applied to timing server 468 for generating the output control signals DCLR#, CLEN#, SELT, SELT#, and DTLT as described above and shown in FIG. 9.

B.3 Delay Line (DL 43)

DL 43, shown in FIG. 11, is constructed from 117 inverter circuits 71, numbered 1–112 and +1 to +5, connected in tandem, each inverter 71 providing a substantially equal propagation delay. The output of each inverter 71 is alternately connected to a NAND gate 72 and a NOR gate 73 for the purpose of providing output pulses having a pulse width corresponding to the tandem delay of five inverters 71 (which implies that DEFI has a pulse width equal to or greater than the tandem delay of five inverters 71).

Because each inverter 71 complements the input signal on output after its inherent propagation delay of $\tau$ seconds, the output of each inverter 71 is the delayed complement of the input. Hence, the output of all odd indexed (1, 3, 5, ...) inverters is delayed and complemented while the output of all even indexed (2, 4, 6, ...) inverters is delayed but not complemented.

By combining in NAND-gate 72 the output of an odd indexed (2k+1) inverter 71 with the output of the higher even indexed (2k+6) inverter displaced by five units, the NAND-gate 72 to which these two outputs are connected forms a series of output pulses, asserted low, the negative going transition occurring coincident (except for gate delays) with the positive transition of the odd index inverter output as shown in (a) of FIG. 12.

Similarly, NOR-gate 73, with index 2k, combines a non-inverted delayed EFI with an inverted (complemented) inverter 71, indexed 2k+5, to form a set of pulses, active low, coincident with the positive transition of the output of inverter 2k and having an pulse width of 5 $\tau$ as shown in (b) of FIG. 12.

The output taps of the NAND gates 72 and NOR gates 73 are supplied to either DMUX 45 or TCMP 44. Taps 1–75 are provided to DMUX 45 for generating three of four differentially delayed clocks. Taps 20, 24, 28, ..., 112, and 17, 21, 25, ... 109 are supplied to TCMP 44 for detection of a delayed clock, delayed by one period of EFI.

B.4 Timing Comparator (TCMP 44)

Figure 13:
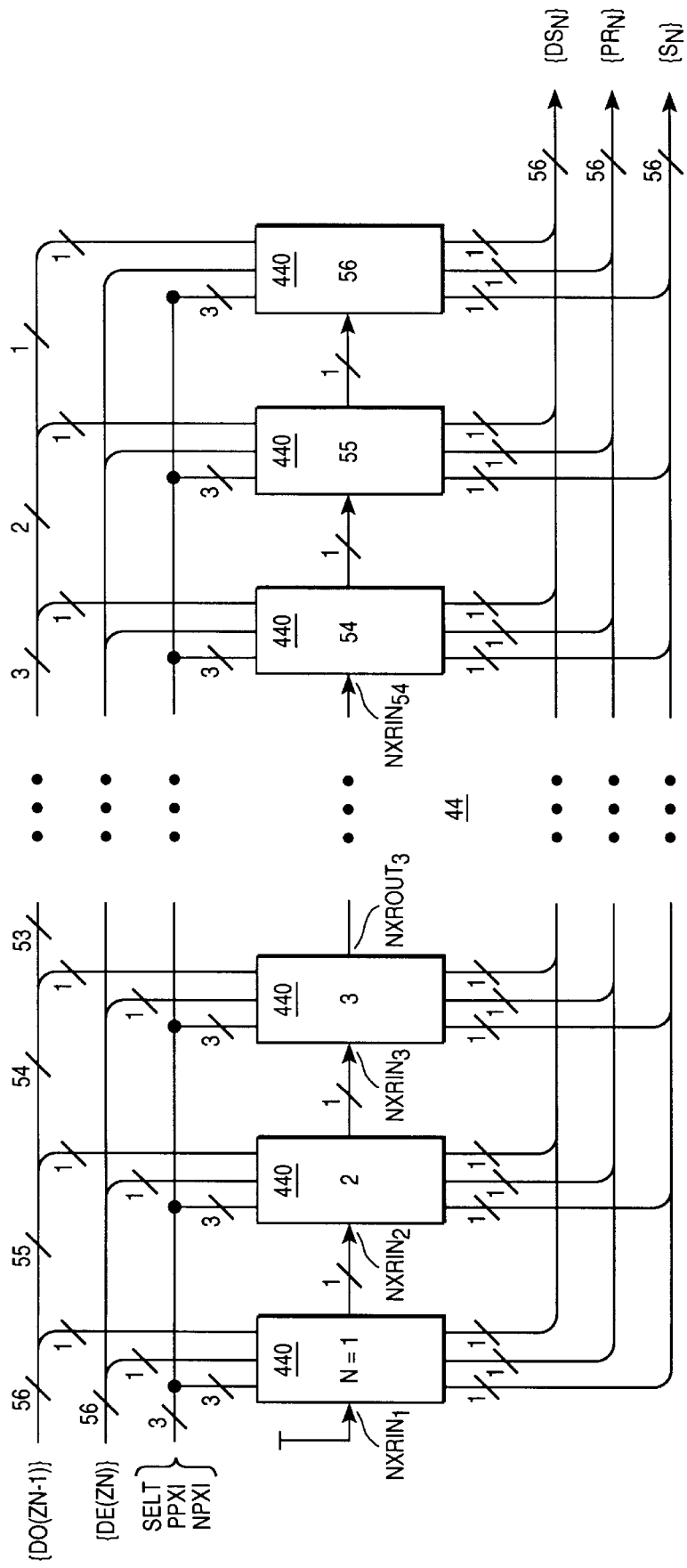
FIG. 13 is a logic schematic for a timing comparator unit.

FIG. 13 shows a TCMP 44 having 56 TCMP units 440 for comparing the 112 DL43 taps with a reference clock (PPXI and NPXI). Each 440 unit handles an even numbered tap which is compared with NPXI or an odd numbered tap which is compared with PPXI. The even and odd numbered tap inputs are respectively labeled DE(2n) and DO(2n−1) for n=1, 2, ..., 56. The comparisons within each 440 unit are made to determine if a coincidence has occurred between the input tap signal and its corresponding reference clock. Input signal NXRIN$_n$ to each 440 unit is the output signal, NXROUT$_{n-1}$, of the previous 440 unit (with the exception that for the first 440 unit (n−1) NXRIN$_1$ is set high). Four sets of output signals ({DS$_n$}, {PR$_n$}, and {S$_n$}) are generated and are interpreted as follows:

- DS$_n$: when asserted high, indicates that the n$^{th}$ TCMP unit 440 detected a coincidence and NXRIN$_n$ was high because the next lowest comparator did not sense a coincidence;
- S$_n$: is a latched version of DS$_n$ which is latched by asserting SELT from SEQC 46; and
- PR$_n$: when low indicates that a coincidence in the n$^{th}$ unit was detected between DO(2n−1) and PPXI and also, no coincidence was detected in the (n−1)th unit between the DE(2n−2) and NPXI;
- NXROUT$_n$: when asserted high indicates that no coincidence was detected in the next lowest (n−1) TCMP unit between DE(2n−2) and NPXI.

The detection status is reported to DTCT 48 by signals DS$_n$, PR$_n$, to DMUX by S$_n$, and to the next higher (n+1) TCMP unit 440 by NXROUT$_n$.

In practice, TCMP 44 can be simplified by not making every comparison between the reference clocks and all of the tap outputs because of the redundancy in the detection between pulses generated by the NAND-gates 72 and NOR-gates 73 of DL 43 that produce output pulse with widths of 5 inverter delays. This means at coincidence, it is possible for five coincidence to be detected (e.g., DE(2n), DO(2n–1), DE(2n–2), DO(2n–3), and DE(2n–4)). The latest coincidence (DE(2n) in this example) is taken to be the time (tap) of coincidence when two adjacent comparators both detect coincidences.

Consequently, in one implementation, the number TCMP units 440 were reduced by only using a subset of the possible 112 TCMP units 440. A further reduction can be made by observing that the lower order taps ($1 \leq n \leq 7$) generally do not have sufficient resolution for a full period to be useful so that a total of 24 TCMP 440 units were used effectively using even DL 43 taps 20, 24, 28, . . . ,112 and odd taps 17, 19, 23, . . . ,109.

Figure 14:
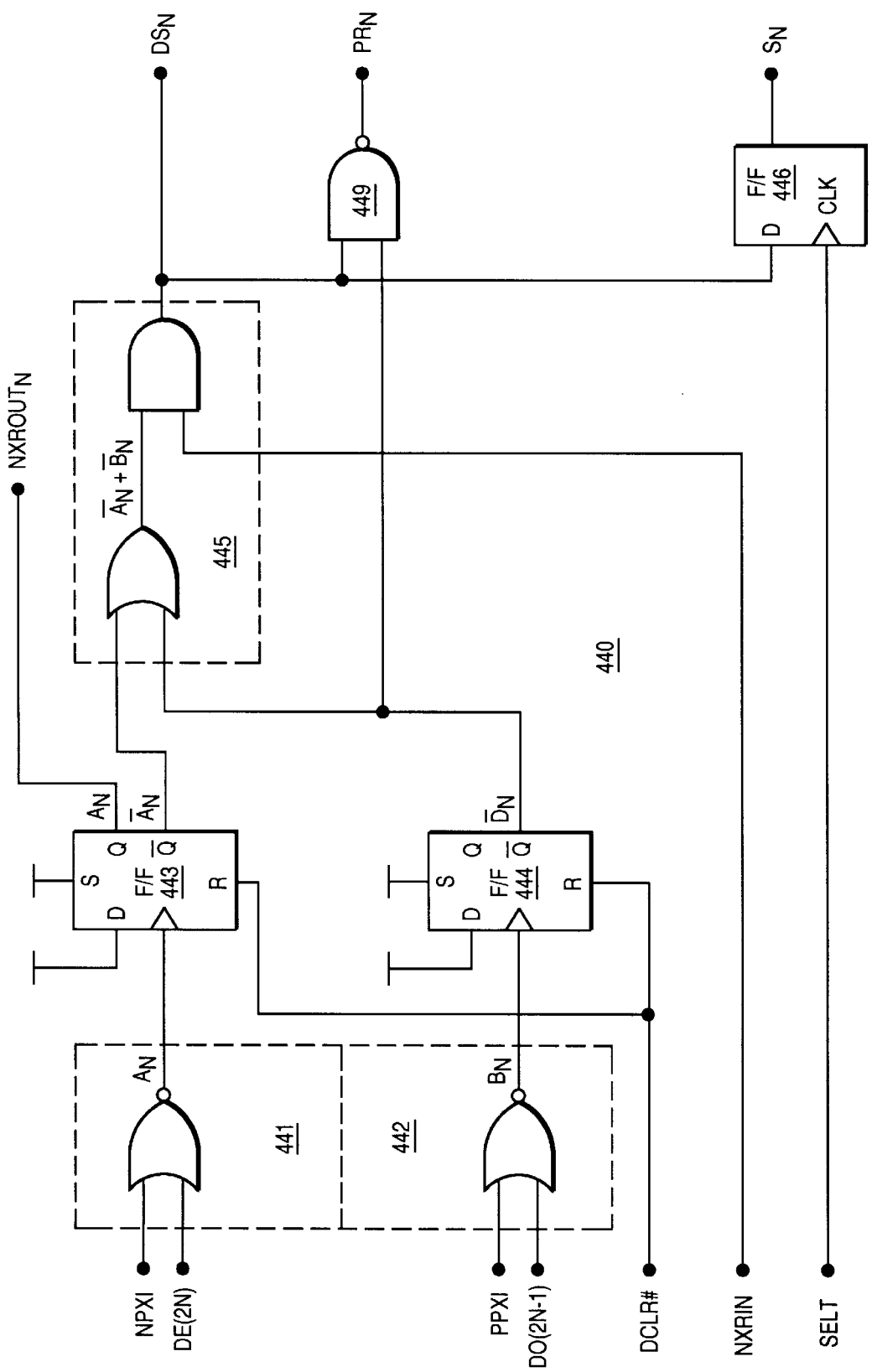
FIG. 14 is a set of TCMP unit waveforms.
Figure 13:
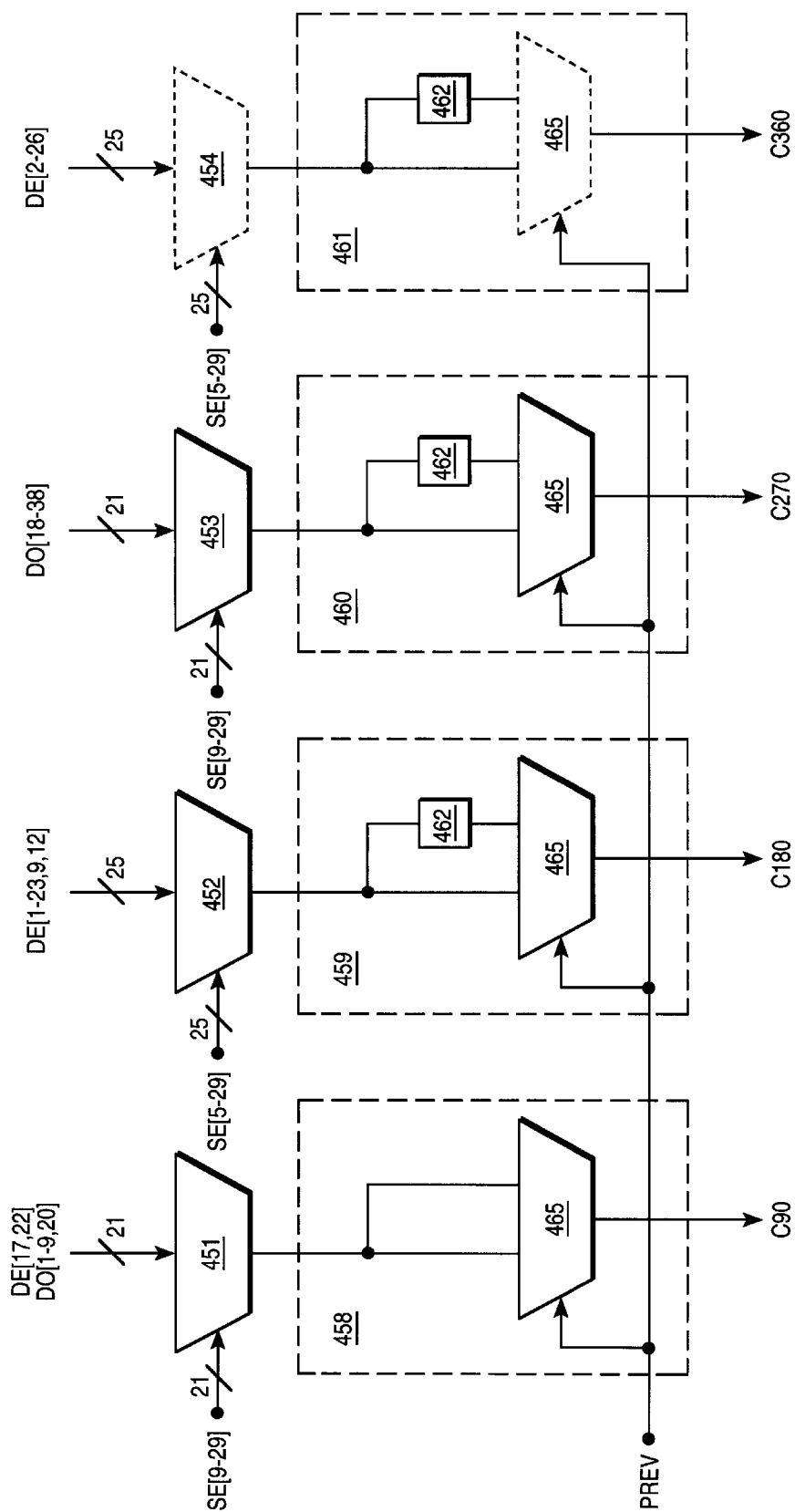

FIG. 14 is a schematic of a typical TCMP comparator unit (CU 440), one of a number (24–56) that make up TCMP 44. Each CU 440 includes two comparators 441 and 442, two detectors 443 and 444, and a conflict detector 445.

The circuit is initialized by asserting DCLR# from SEQC 46 which clears the D-type flip-flop detectors 443 and 444. When PGEN 42 asserts references PPXI and NPXI, NOR-gate comparators 441 and 442 respectively compare NPXI with DE(2n) and also PPXI with DO[2n–1]. If the reference (NPXI or PPXI) does not find the corresponding DL 43 output (DE[2n] or DE[2n–1]) coincident, the output of the corresponding detector NOR gate is set high and if coincidence is detected, the output is set low.

FIGS. 15 and 16 show waveforms associated with comparators 443 and 444 and in both cases the waveform shown at line (a) is the CLEN waveform generated by SEQC 46 which, when low, provides a window during which the comparisons can be made by detector 443 and 444. Each figure is arranged with four groups of waveforms (b–d, e–g, h–j, and k–m). Group (b–d) shows the waveforms associated with comparator 442 of the $(n+1)^{th}$ TCMP unit 440; group (e–g) waveforms are for comparator 441 of the $n^{th}$ TEMP unit 440; group (h–j) for comparator 442 of the $n^{th}$ TEMP unit 440; and group (k–m) for comparator 441 of the $(n-1)^{th}$ TEMP unit 440. The first two (upper) waveforms of each group are the inputs to their respective comparators while the last (lower) waveform is the output of each respective comparator.

In FIG. 15, coincidence occurs in group (h–j) at comparator 442 of the $n^{th}$ unit. Waveform (j) shows the result of the comparison: the output remains low. The output of comparator 441 of the $n^{th}$ unit ($A_n$) remains low indicating coincidence. Comparator 442 of the $n^{th}$ unit produces output $B_n$ at line (g) at line (g) and goes high for the interval in which both PPXI and DO(2n–1) are both low. (Recall that DO(2n–1) and DE(2n) in the 24 TCMP unit implementation are separated by 4 DL43 taps.) Similarly, waveform $A_{n-1}$ and $B_{n+1}$ respectively at lines (d) and (m) also go high indicating no-coincidence.

In FIG. 16, the same set of comparators are used but coincidence occurs at comparator 442 of the $n^{th}$ unit. All other comparators show no-coincidence.

The output of comparators 441 and 442 are supplied to detectors 443 and 444 (two D-type flip-flops) that have been cleared by DCLR# setting both Q outputs high and both $\overline{Q}$ outputs low. If the output from either comparator (441 or 442) is high, the corresponding D input ($V_{CC}$) is clocked-in causing the $\overline{Q}$ output low and Q output high. Otherwise, the $\overline{Q}$ output is latched high.

The output of detectors 443 and 444 are applied as inputs to conflict detector 445 so that if either $\overline{Q}$ outputs are low (indicating coincidence) the low state is passed on by the input OR-gate to the output AND gate where it is combined with NXRIN. Thus if NXRIN is low (indicating no (DSn) coincidence in the previous TCMP) unit 440, the output of conflict detector 445 (DSn) goes low indicating no conflict (i.e., two adjacent TCMP units 440 do not have high NXROUT states). Conversely, if NXRIN is high and the $\overline{Q}$ output of both detectors is low, indicating both comparators show coincidence, $DS_n$ goes high indicating a conflict.

The output of conflict detector 445 is also routed to result latch 446, a D-type flip-flop, for latching the comparison result when SELT is asserted high providing output signal Sn to DMUX 45, which when asserted instructs DMUX 45 to synthesize a clock signal from three differently delayed clocks.

NAND gate 449 combines $DS_n$, the output of conflict detector 445, with the $\overline{Q}$ output state of detector 444 to produce output signal PRn. If PRn is high, it indicates that either DO[2n–1] was coincident with PPXI or DE[2n–2] was not coincident with NPXI.

Because TCMP 44 has 24 CU 440 units, each a with comparison result output latch 446, the resolution implied by latch 446 is four DL 43 inverter delay units. This resolution is improved by a factor of two by signal PRn that indicates even (n=2k) or odd (n=2k–1).

FIG. 17 is a truth table that summarizes the behavior of TCMP 44 as a function of two comparator outputs (An, Bn) and $NXRIN_n$.

B.5 Error Detector (DTCT 48)

DTCT 48 monitors the status of error flags that include the following:

ODER—(over detect error) generated when all CU 440 units of TCMP 44 declare {DS[n]} active indicating a one period later coincidence with EFI; or when TCMP fails and is only used for test purposes.

OVFL—(overflow) generated when the period of EFI is longer than the DL 43 total delay, indicated when all DS[n] signals are not asserted, and causes the DMUX to operate in the fixed tap mode by extracting three differential delayed clocks from a set of fixed taps corresponding to ¼, ½, and ¾ of the total DL 43 delay (taps 28, 56, and 84)

ORn—(duplicate detection) generated when the $n^{th}$ CU 440 and the 2nth CU 440 both declare a one period later coincidence causing DTCT 48 to disable the $2n^{th}$ and higher order coincidences by activating output signal OR[n].

DTCT 48 also monitors TCMP 44 signal sets {DS[n]} and {PR[n]} for generating multiplexer enable signals for DMUX 45.

SEQC 46 output signal DTLT is used by DTCT 48 to latch input signals PR[n} and DS[n}

FIG. 18 is a functional block diagram of DTCT 48. SEQC 46 provides control signal DTLT for latching output latches 487–493. TCMP 44 provides 24 input signals, PR[5:28], that are applied to 24-input AND network 486, the output PREV indicates, when high, that all PRn signals are high which means that no detection for coincidence between PPXI and any DO(2n–1) was made ($B_n$=1). Conversely, when PREV is low, it means that coincidence was found ($B_n$=0 for some n) and that the comparison between NPXI and DE(2n–2) in the $(n-1)^{th}$ TCMP unit failed ($A_{n-1}$=NXRINn=1). The state of PREV is latched into latch 493.

TCMP 44 also provides another set of 24 input signal, DS[5:28] that are applied to the 24-input AND network 485 for producing output signal ODER that is latched in latch 492 for use in test mode. 4-input OR network 481 combines DS[25:28] to produce at the output of latch 488 control signal OR 32 to DMUX 45. Similarly, OR networks 482, 483, and 484 respectively, accept at input DS[17, 24], DS[9,

16], and DS[5:8] for respectively producing at latches 489, 490, and 491 output DMUX control signals OR24, OR16, and OR8. The output of any OR-network 481–484 is high if one of the DSn signals from a TCMP 44, associated with a particular OR-network, is asserted indicating a coincidence at the $n^{th}$ TCMP unit 440, but not for a lower order (<n) TCMP unit 440. The output of OR-gates 481–484 are combined by 4-input OR-gate 494 to produce DMUX control signal OVFL (overflow) in latch 487, which indicates overflow when not asserted high.

B.6 Differential Delay Multiplexer (DMUX 45)

DMUX 45 extracts DL 43 delayed clock pulses corresponding to delays of ¼, ½, and ¾ of the EFI clock period from the 112 output taps of DL 43. The pulses have widths equal to 5 inverter 21 delays of DL 43.

FIG. 19 is a functional block diagram of DMUX 45, a collection of fully decoded selectors (MUX) 451–453, and 458–460. MUX 451 and 453 are 21 input units with respective data inputs DE[17,22], DO[1-9, 20] and DO[18:38] and decoded line select signals S[5-29] for both MUXs. MUX 452 is a 25 input unit with data inputs DE[1-23, 9, 12] and decoded line select signals S[5:29].

The outputs of MUXs 451–453 and optional MUX 454 are further processed by MUX circuits 458–460 and optional MUX 461. MUXs 451–454 accept, at data input, selected output taps from DL 43 taps DE[1-56] and DO[1-56]. The purpose of these MUXs is to select the state of DL 43 at taps corresponding to times T/4, T/2, 3T/4, and T of the reconstructed clock where T corresponds to the first detected coincidence with EFI. The subset of taps that must be considered for these intervals, corresponding to 90°, 180°, 270°, and 360° of an EFI cycle, are shown at the top as inputs to MUXs 451–454. Each MUX (451–454) is a completely decoded selector network that has as many selection control lines SE, as input taps. The active SE line causes the corresponding input to be selected at the MUX output line.

MUX networks 458–459 each have a 2-input/1-output MUX 465. One input is connected directly to the output of the corresponding MUX 451–454. The second input, except for MUX network 458, is connected to the output of a delay cell 465, each 465 having a one inverter delay. MUX network 458 has two identical inputs to MUX 465. MUX network 461 has two delay cells in tandem at the second input. The purpose for MUX networks 458–461 is to introduce a time delay correction, as discussed below, that depends on the state of control signal PREV supplied by DTCT of FIG. 18.

FIG. 20 is a table showing the relationship between index n of the selector signals, {SE[n]}, and the corresponding DL 43 output tap for producing the C90, C180, and C270 output from DMUX 45. Column 0 lists the index n. Column 7 lists the DL 43 tap number at which a first full period coincidence occurs between DEFI and the tap corresponding to the listed tap number. Columns 1, 3, and 5 represent the tap number corresponding to ¼, ½, and ¾ of column 7 which would ideally correspond to the ¼, ½ and ¾ of periods of DEFI. However, because of delays inherent in the circuit implementation between PGEN 42 and the PHGEN 47, the output clock synthesizer, the actual taps sampled for T/4, T/2, 3T/4, and T must be corrected by a time delay offset (a time advance). The time delay offset associated with T/4 (col. 1) is 11 inverter delay units, for T/2, 3T/4, and T (cols. 3, 5, and 7) it is 12 inverter delay units. Thus, for example, if T-TAP is tap 100, then T/4, T/2, 3T/4, and T would respectively correspond to taps 25, 50, 75 and 100. Applying the time delay offsets modifies these tap indices to 14, 38, 63, and 88 as shown respectively in columns 2, 4, 6, and 8.

One further detail should be noted in the table of FIG. 20 for values of n≦11: by applying the offset correction of 11 directly to tap indices of T/4 in column 1, TAP≦0. This anomaly can be avoided by recognizing that the clock signal DEFI is periodic in T corresponding to the tap indices, T_TAP, in column 7 and therefore values for the tap number corresponding to the value (T/4–11), can be obtained by forming the modulo arithmetic term $$\text{TAP} = (T/4-11) \bmod (T\_\text{TAP}) = T/4-11+(T\_\text{TAP})$$

as shown in column 2 for n=9, 10, and 11. For the value of TAP for n=5 and 6 in column 4, the value is given by $$\text{TAP} = (T/2-12) \bmod (T\_\text{TAP}) = T/2-12+(T\_\text{TAP})$$

In other words, the modulo (T_TAP) operation corresponds to a circular shift of the taps.

Because the tap index, n, corresponding to T may not be divisible by 4, except for the subset, DE[2k] for k=1, 2, . . . , which satisfies the condition $$n \bmod 4 = 0$$

a fractional value corresponding to the remainder, R, given by $$\tfrac{1}{4}(n \bmod 4) = R/4, \text{ for } R=1, 2, \text{ or } 3$$

must be adjusted to a integer value of n=n'.

Because a subset of all taps (1–112) was used in TCMP 44, specifically the subset DE[2k] and DO 92k–1], for k=2, 4, 8, . . . The subset DE[2k] corresponds to tap index set n=4, 8, 12, . . . , 112, each value of which is divisible by 4 without a remainder while the series DO[2k–1] corresponds to n=3, 7, 11, . . . 111 which when divided by 4 has a remainder of ¾. If taps corresponding to DE[2k] are used by adding +1 to n odd (3, 7, 11, . . . ) then the tap indices corresponding to T/4, T/2, 3T/4, and would have a positive error making the delay too long by ¼, ½, ¾, and 1 inverter delay, respectively. If a strategy of rounding-up is used, when the remainder is ≧½, then a correction for the index corresponding to T/4, T/2, 3T/4, and T would be 0, –1, –1, and –1 inverter delay units, respectively. Other rounding strategies would lead to a different set of corrections. For example, if the rule was to round-up if the fractional remainder is >½, the set of corresponding corrections would be 0, 0, –1, –1 inverter delays.

Referring back to FIG. 19, it can now be seen that the purpose of MUX networks 458–461 is to introduce a rounding correction for the tap indices corresponding to clock intervals T/4, T/2, 3T/4, and T. Control signal PREV senses if the index corresponding to a full period delay, T, is odd or even. If even, the detection was made by a comparator with an index, n, that is an integer multiple of 4, producing a coincidence detection value out of the $n^{th}$ TCMP unit 440 of $A_n=0$, $B_n=1$. Otherwise, if n mod 4≠0, the $n^{th}$ TCMP unit 440 coincidence detection was made by the $n^{th}$ TCMP unit with comparator outputs of $B_n=0$, $A_n=1$. Control signal PREV performs this function and selects no correction if $A_n=0$ and the delay correction of $B_n=0$.

B.7 Phase Generator (PHGEN 47)

The purpose of phase generator 47 is to synthesize a variety of clock signals including a clock with a rate equal to one-half the EFI rate (2X), equal to the EFI rate (1X), or twice the EFI rate ((½)X) with 50% duty cycles and rising transitions that are synchronous with the rising transitions of EFI.

FIG. 21 is a functional block diagram of PHGEN 47 that has three generators; IPHGEN 471, the internal phase generator for generating clock signals PH-1 and PH-2; COGEN 472, the clock-out (CLKOUT) generator; and CIGEN 473, the clock-in (CLKIN) generator. Predivider 474, a binary divider network for generating half rate clock signal DV1 and its complement DV2 operates on EFI and is provided with a reset input RST for restoring the divider network flip-flop to a known initial state. Clock mode decoder (CMDC) 475 provides the mode select in control signals for the three generators. The four modes, including single (1X), double (($\frac{1}{2}$)X), divide (2X) and bypass, are selected by two control signals EFISEL and BUSSEL that are decoded to provide four fully decoded control lines, one for each mode.

FIG. 22 is a detailed functional block diagram of IPHGEN 471 and includes five pulse generators 4711 using differential delays that logically invert and delay the incoming clock signal so that when combined with the undelayed incoming clock an output pulse of length corresponding to the delay is generated. Pulse widths of 3 differential delay line units are produced at the output, the pulse widths being of sufficient duration to properly operate RS flip-flop 4913.

One pulse generator 4711 associated with EFI as the input, has an inverting input so that both EFI and EFI# are available to MUX 4712 as pulses EFI-1 and EFI-2, respectively.

Multiplexer (MUX) 4712 synthesizes the required waveform from the pulses provided by pulse generators 4711 by selecting the inputs in a prescribed sequence to drive RS flip-flop 4713 in accordance with the mode selected by CDMC 475. Buffers 4714 provide output current drive for the non-inverting (Q) and inverting (Q#) outputs.

FIG. 23 shows how the waveforms are selected by MUX 4712 and are used to drive RS flip-flop 4713. For example, in the DIVIDE mode, line (c), a half frequency clock at the Q or PH-1 output, is generated by DV-1 alternatively driving the set (S) and DV-2 driving the reset (R) inputs of RS flip-flop 4713 with the waveform of line (c) appearing at the output buffer 4714 connected to the Q output of RS flip-flop 4713. Similarly, the inverted divide-by-two clock of line (d) appears at the Q# and PH-2 output. In the BYPASS mode, the waveform on line (g) is generated by applying EFI1 of line (e) to the S and EFI2 of line (f) to the R input of RS flip-flop 4713. The SINGLE mode clock waveform of line (i) is produced by selecting EFI-1 at S and C-180 (shown on line (h)) at R. The DOUBLE mode clock is produced by alternately selecting EFI-1 and C-180 for (S) of the set input S, and alternately selecting C-90 (line (j)) and C-270 (line (k)) for (R) the reset input for each cycle of EFI-1.

FIG. 24 is a detailed block diagram of the COGEN 472 phase generator that includes pulse generators 4711, MUX 4715, RS flip-flop 4716 and output buffer 4717. The sequence of operation of MUX 4715 is selected by the four-line mode select input to MUX 4715.

FIG. 25 shows the CLKOUT signal waveforms and the selection of the MUX 4718 input signals for the four modes: DIVIDE, line (c); BYPASS, line (f); SINGLE, line (h); and DOUBLE, line (j).

DIGEN 473, shown in FIG. 26, includes pulse generators 4711, MUX 4718, RS flip-flop 4719, and output buffer 4720. The four line mode selector controls the order of accessing the pulse generator 4711 outputs for drawing RS flip-flop 4719. The waveforms and order of selecting the input signals to MUX 4718 are shown in FIG. 27 for modes: DIVIDE, line (c); BYPASS, line (f); SINGLE, line (h); and DOUBLE, line (j).

It should be noted that C360 can be used optionally by MUXs 4712, 4715, and 4719 in place of EFI-1 for the generation of waveform respectively shown in FIGS. 22, 24, and 26.

In the previous examples of clock waveform generation, it has been assumed that EFI has a period that is less than the maximum delay of DL 43 (112 inverter delays in the example shown). If the period is greater than the maximum delay, DTCT 48 will detect an overflow by means of OR-gates 481–484 and 494 with the results latched in output latch 487. The state of latch 487, is made available to DMUX 45, and when asserted it indicates overflow (OVFL). Under these circumstances PHGEN 47 constructs the ($\frac{1}{2}$)X and 1X clocks as shown in FIG. 28. At line (a), EFI is shown having a period that is substantially longer than the maximum DL 43 delay. At lines (b)–(e), DMUX 45 output signals EFI-1, C90, C180, and C270 are shown. C90, C180, and C270 correspond to DL 43 taps n=29, 58, 87 corresponding to $\frac{1}{4}$, $\frac{1}{2}$, and $\frac{3}{4}$ of n=116, which is the next highest even tap that is a multiple of 4 and greater than the maximum delay tap n=112. The 1X clock at line (g) is generated by applying EFI-1 to the set input of RS flip-flop 4713 of IPHGEN 471 and C180 to the reset input. This creates a clock signal that has a period equal to EFI but with a high state that is equal to $\frac{1}{4}$ of the maximum delay of DL 43. At line (f), a ($\frac{1}{2}$)X clock signal is shown in which two clock pulses of equal duration ($\frac{1}{4}$ of maximum DL 43 delay) in each period of EFI. The ($\frac{1}{2}$)X clock signal is generated by alternately applying EFI-1 and C180 to the set input of RS flip-flop 4713 and C90 and C270 alternately to the reset input, as shown.

A further feature of the DDL is its ability to produce an early clock when required by advancing the tap selections in DMUX 45, similar to the tap advance of 11 inverter delay units used to compensate for the interval delays between PGEN 42 and PHGEN 47 and incorporated in the table of FIG. 20. By introducing an additional tap advance, modulo Q, where Q is the number of delays in a period of EFI. An example is shown in FIG. 29, where an early ($\frac{1}{2}$)X generated clock at line (e) and a 1X generated clock at line (f) is shown. Both clocks have been advanced by approximately $\frac{1}{16}$ of the EFI period, T) In this case, the C360 is used in place of EFI and is advanced by T/16 as shown on line (b). Similarly, C90, C180, and C270 are used after being advanced by T/16.

Although the present embodiment of the DDL clock generator is limited to ($\frac{1}{2}$)X, 1X, and 2X clock generation it will be appreciated by those practicing the art that the principles taught in the preceding description are readily extended to generating submultiple clock rates, KX, and multiple clock rates (1/K)X, KX, where K$\geq$2.

For example, in the DIVIDE by K mode, every MUX 4715 would select every other $K^{th}$ EFI pulse to drive the set input of RS flip-flop 4713 and every other $K^{th}$ pulse, displaced by K/2, to drive the reset input.

In the multiply-rate-by-K mode, where for example, K=4, the set input of RS of flip-flop 4713 would be driven by MUX 4715 using the periodic sequence EFI1, C90, C180, and C270, while the reset input would be driven by the periodic sequence C45, C135, C225 and C315 which is interleaved with the set sequence.

An alternative embodiment for a DDL clock generator can include additional circuitry of the type described for generating other clocks that are multiples or fractions of the EFI clock rate. FIG. 30 shows such an embodiment in which DMUX 45 working cooperatively with DL 43 and TCMP 44 produces additional output clock phases corresponding to C60, C120, C240, and C300 that can, for example, produce an additional output clock operating at three times the EFI rate. One set of outputs, which are the same as shown in FIG. 22 for phase generator 47 subsystem 471. Another subsystem 471' has been added that accepts the DMUX 45 outputs corresponding to C60, C120, C180, C240, C300, and C360 for generating a PH1 and PH2 output that has a rate that is three times that of EFI. By providing additional control signals like EFISEL and BUSSEL, clock mode decoder (CMDC) 475 of FIG. 21 can be expanded to provide all additional decoded mode select lines needed for each subsystem 471' added. Each added subsystem can be operated independently for providing any combination of multiple or fractional EFI clock rates. By changing the input code to CMDC 475, the clock generation mode may be dynamically controlled, changing, as desired, from one mode to another.

B.8 DDL Clock Generator with Feedback

Because changing environmental conditions and aging of circuit components may cause a drift in key circuit parameters in the feedforward DDL clock generator of FIG. 5, and, in turn, cause a drift in the synchronous relationship between the synthesized clock (PH1) and the reference clock EFI, synchronous operation can be assured by providing feedback control of the overall feedforward circuit delay by comparing the reference clock (EFI) with the synthesized clock (PH1) and producing an error control signal for adjusting a controllable delay element in the feedforward circuit. Because the range of controllable delay is a fraction of a clock period, the use of fast circuitry in the feedback path will ensure a minimum loss in the speed of adaptation of the DDL clock generator relative to the open-loop implementation previously described.

FIG. 31 shows how the DDL clock generator of FIG. 5 can be augmented by the inclusion of phase detector (PHD) 51 and adjustment delay line (ADL) 52. PHD 51 compares EFI 41 with synthesized output clock PH1 by means of PHD 51 and produces at its output an error signal (ADL control) that is applied to the adjustable delay element (ADL 52) located between DMUX 45 and PHGEN 47. ADL 53 adjusts the delay applied to each of the four input channels from DMUX 45 and produces at the ADL output a suitably delayed set of DMUX output signals so as to ensure synchronism between PH1 and EFI.

FIG. 32 shows a suitable per channel logic level implementation of PHD 51 that includes a pulse generator 510, a detector 520, and an output latch 525. The operation of PHD 51 will be described by way of the three cases shown in FIGS. 33–35; Case I (FIG. 33) shows the associated waveforms when PH1 lags EFI; Case II (FIG. 34) when PH1 leads EFI; and Case III (FIG. 35) when PH1 and EFI are synchronous.

First consider Case I of FIG. 34 in which EFI, on line (a), is shown to lead PH1, on line (b). EFI and PH1 are applied to pulse generator 510 where each is delayed by five inverters in circuit 511. Each of the delayed and non-delayed signals is applied to a NAND-gate 512 for producing, at the upper NAND-gate output, EEG as shown in FIG. 34, line (c) and at the lower NAND-gate, output PEG as in lien (d). Both PEG and ERG have a fixed duration of five inverter delays.

The output of each NAND-gate 512 is applied to an input of a corresponding three-input NOR-gate 513 where the upper NOR-gate combines CLEN#, EEG, and PH1 to produce output signal ECG as shown on line (h) of FIG. 33.

Similarly, the lower three-input NOR-gate 513 combines EFI, PEG, and CLEN# to produce, at its output, PCG as shown on line (i).

Detector 520 includes an upper and lower latching unit each made-up of an OR-gate 521, a NAND-gate 522, and an inverter 523. L#, the output of the upper latching unit is shown on line (j) and satisfies the following logic condition.

$$L\# = \overline{(ECG+L) \cdot DCLR\#} \tag{1}$$

Thus, L#=1 if DCLR#=0 or ECG=0, as shown on line (j) at t=t$_2$. At t=t$_3$, DCLR#=1 and ECG remains low so L# remains high until ECG at t=t$_4$ goes high, causing L#=0 latching L# low until t=t$_6$ when DCLR# goes low and latches L#=1. In this manner, the waveform L# is generated.

In a similar manner, F# is generated by the lower latching unit, where F# satisfies the following logic condition.

$$F\# = \overline{(PCG+F) \cdot DCLR\#} \tag{2}$$

At t=t$_1$, F#=0 so that the first term in the brackets is high independent of the state of PCG because F=1. Also, DCLR# is high. At t=t$_2$ PCG remains low while DCLR# switches from high to low causing F# to latch high, where it remains. NOR-gate 524 forms J#=$\overline{L\#+F\#}$ which remains low.

At t=t$_5$, DTLT goes high and latches inputs L#, J#, and F# into latch 525 which are made available at the output at LATE#, JUST# and FAST#, respectively. Thus, Case I (PH1 lags EFI) results in the three latch 525 outputs shown in lines (l) and (m) at time t=t$_5$.

FIG. 34 shows the waveforms associated with Case II in which PH1 leads EFI as shown on lines (a) and (b).

FIG. 35 shows the waveforms associated with Case III in which PH1 and EFI are synchronous, as indicated on lines (a) and (b).

The following table summarizes the output slates of PHD 51.

|          | LATE# | JUST# | FAST# |
|----------|-------|-------|-------|
| Case I   | 0     | 1     | 1     |
| Case II  | 1     | 1     | 0     |
| Case III | 1     | 0     | 1     |

Thus, the low state for each case indicates whether PH1 is late (Case i), early (Case II), or just in time (Case III) with respect to EFI.

The three output signals from PHD 51 together with EFI, are used to control ADL 53 as shown in FIG. 36. Up/down counter 535 up-count is controlled by FAST# and the down-count by LATE#, when applied to inverting U and D terminals respectively. The clock input C is from the output of AND-gate 537 that has EFI as one input and JUST# through an inverting input at the other input. Up/down counter 535 only counts up or down when JUST# as low and EFI transitions from low to high. Thus, counting is enabled whenever PH1 is not synchronous with EFI (Case I or II).

The 3--bit output of up/down counter 535 is applied to decoder 536 that produces at output a fully decoded set of eight lines with one-out-of eight lines active, the active line corresponding to the binary input code from up/down counter 535. Thus, each unique binary input code closes a particular solid state analog switch 541 connecting on top of tapped delay line array (DLA) 530 to selector output latch 542.

DLA 530 is constructed from a set of 14 serially connected inverters 531 and with eight uniform delay taps. One DLA 530 and selector 540 assembly is required for each of four DMUX 45 outputs (C90, C180, C270, and C360).

The ability to adjust for extraneous overall delays through the DDL clock generator is limited by the maximum amount of delay in the adjustment delay lines 53 or 53' and the resolution of the adjustable delay increments. The resolution is governed by the inherent delay of the discrete delay elements (such as inverters 531 of FIG. 36) and the number of discrete delay elements used between delay line array taps. The maximum amount of delay is determined by the number of taps implemented in delay line array (DLA) 530.

The number of taps to be controlled determines the number of decoded output lines from decoder 536: one output line per tap. The number of taps also determines the number of binary encoded output lines from up/down counter 535 and hence the range of the up/down counter.

In this manner the required amount of delay to ensure synchronism is introduced into each of the DMUX 45 output signals.

FIG. 37 shows an alternative embodiment of a DDL clock generator with feedback phase control. Adjustment delay line, ADL 53', is introduced between pulse generator 42 and delay line 43. The phase detector, PHD 51, functions as previously described, comparing the phases of EFI and PH1 and producing an output error signal.

ADL 53' includes three units, as shown in FIG. 32. The three units are used to control the delay of PPXI, NPXI, and DEFI produced by PGEN 42. After introducing a variable delay (controlled by PHD 51 output error signal), DEFI is passed on to DL 43 while NPXI and PPXI are passed on to TCMP 44.

As in the case of ADL 53, shown in FIG. 36, ADL comprises DLA 530, up/down counter 535 decoder 536, and selector 540'. Selector 540' is an alternative embodiment of a selector for selecting one-out-of-N delay line taps. Decoder 536 activates the one-out-of-N output line that corresponds to the encoded output of up/down counter 535 and enables the corresponding AND-gate 544 so that, when the corresponding input from DLA 530 is high, it is transmitted through one of the NOR-gates 545 to NAND-gate 546.

In this manner, PPXI, NPXI, and DEFI are delayed by equal variable amounts of time thereby delaying or advancing PH1 relative to EFI as required for synchronism.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A generator that generates an output signal in response to an external signal comprising:
    a delay means for providing a plurality of delayed images of the external signal;
    a timing comparison means for determining which one of the plurality of delayed images has a predetermined delay relative to the period of the external signal;
    a circuit means coupled to said timing comparison means and said delay means for generating the output signal; and
    a phase synchronization means for detecting a phase difference between the external signal and the output signal and for substantially synchronizing the phase of the output signal with the phase of the external signal.

2. The generator of claim 1 wherein the output signal substantially has a 50% duty cycle.

3. The generator of claim 2 wherein the circuit means comprises:
    a selection means for selecting a set of delayed images from said plurality of delayed images of the external signal, wherein one of the delayed images in the set of delayed images represents the predetermined delay; and
    a waveform generation means for generating the output signal based on the selected set of delayed images of the external signal.

4. The generator of claim 3 wherein the rate of the output signal is selectably proportional to the rate of the external signal.

5. The generator of claim 1 wherein the delay means comprises a tapped differential delay line comprising a set of output taps that provide the plurality of delayed images of the external signal, each tap having a differential delay between successive taps, each differential delay corresponding to a fraction of the period of the external signal, the set of output taps providing a total delay of at least one period of the external signal.

6. The generator of claim 5 wherein the timing comparison means compares the external signal with a subset of the plurality of delayed images at the output taps to determine which output tap has a delayed signal with a period closest to one period of the external signal.

7. The generator of claim 5 further comprising a pulse generator that accepts the external signal and outputs to the tapped differential delay line a modified external signal with substantially uniform pulse widths that are at least equal to the differential delay between successive taps of the tapped delay line.

8. The generator of claim 1 wherein the phase synchronization means comprises:
    a phase comparator that accepts as inputs the output signal and the external signal, and outputs a phase difference signal; and
    an adjustable delay circuit that produces an adjustable delay in the output signal in response to the phase difference signal.

9. A generator that generates an output signal in response to an external signal comprising:
    a delay line comprising a plurality of output taps to provide delayed images of the external signal;
    a timing comparator coupled to the delay line and said external signal;
    a a multiplexing circuit coupled to the timing comparator and further coupled to the plurality of output taps to select a delayed image;
    a waveform generator coupled to the multiplexing circuit to generate the output signal; and
    a phase synchronization circuit, coupled to the waveform generator, for providing phase difference signal between said external signal and said output signal.

10. The generator of claim 9 wherein the timing comparator determines which one of said delayed images having a predetermined delay relative to the external signal.

11. The generator of claim 10 wherein the multiplexing circuit is operable to select at least two of the plurality of delayed images, wherein one of the selected images corresponds to the predetermined delay and another selected image corresponds to a delay that is a fraction of the period of the external signal.

12. The generator of claim 9 wherein the rate of the output signal is proportional to the rate of the external signal.

13. The generator of claim 12 wherein the rate of the output signal is selectable.

14. The generator of claim 9 wherein the output signal has a 50% duty cycle.

15. The generator of claim 9 wherein the phase synchronization circuit comprises an adjustment delay line to provide an adjustable delay in the in response to said phase difference signal to substantially synchronize the phase of the output signal with the phase of the external signal.

16. The generator of claim 15 wherein the adjustment delay line is coupled to the waveform generator.

17. The generator of claim 15 wherein the adjustment delay line is coupled to the delay line.

18. The generator of claim 9 further comprising a pulse generator that outputs the external signal in response to an initial signal, wherein the external signal has substantially uniform pulse widths that are at least equal to the delay between the output taps of the delay line.

19. A method of generating an output signal in response to an external signal, comprising the steps of:

providing a plurality of delayed images of the external signal;

comparing a subset of the plurality of delayed images to the external signal to determine which delayed image has a predetermined delay relative to the period of the external signal;

selecting the delayed image that corresponds to the predetermined delay to generate the output signal;

comparing the phase of the output signal with the phase of the external signal; and adjustably delaying the output signal to substantially synchronize the phase of the output signal with the phase of the external signal.

20. The method of claim 19 further comprising the step of generating the output signal such that it has a 50% duty cycle.

21. The method of claim 20 further comprising the step of selecting at least another one of the delayed images that corresponds to a delay that is a fraction of the period of the external signal.

22. The method of claim 21 further comprising the step of selecting the rate of the output signal such that it is proportional to the rate of the external signal.

23. The method of claim 19 further comprising the step of accepting an initial signal and generating the external signal, such that the external signal has substantially uniform pulse widths.

24. The method of claim 19 further comprising the step of using a tapped differential delay line to provide the plurality of delayed images of the external signal.

25. A generator that generates an output signal having a 50% duty cycle in response to an external signal, comprising:

a differential delay line comprising a plurality of output taps to provide differentially delayed images of the external signal;

a timing comparator coupled to at least a subset of the plurality of output taps to determine which output tap has a first predetermined delay relative to the external signal;

a multiplexer network coupled to the timing comparator and the differential delay line to select a first delayed image corresponding to the first predetermined delay and a second delayed image corresponding to a second predetermined delay relative to the period of the external signal;

a waveform generator coupled to the multiplexer network to provide the output signal;

a phase comparator having a first input coupled to the output signal, a second input coupled to the external signal, and an output to provide a phase difference signal representing the phase difference between the output signal and the input signal; and an adjustment delay line coupled to the waveform generator and the phase comparator to adjustably delay the output signal to substantially synchronize the phase of the output signal with the phase of the external signal, in response to the phase difference signal.

26. The generator of claim 25 wherein the waveform generator comprises a set-reset flip-flop (RSFF).

27. The generator of claim 25 wherein the rate of the output signal is selectably proportional to the rate of the external signal.

28. The generator of claim 25 wherein the first predetermined delay corresponds to an output tap having a relative delay of approximately one period of the external signal.

* * * * *